(12) United States Patent
Kim et al.

(10) Patent No.: US 11,502,151 B2
(45) Date of Patent: Nov. 15, 2022

(54) DISPLAY DEVICE

(71) Applicant: Samsung Display Co., LTD., Yongin-si (KR)

(72) Inventors: Jae Won Kim, Cheongju-si (KR); Seung Woo Sung, Cheonan-si (KR); Ji Hyun Ka, Seongnam-si (KR); Na Yun Kwak, Cheonan-si (KR); Dae Suk Kim, Seongnam-si (KR); Ah Young Kim, Hwaseong-si (KR); Jun Young Min, Suwon-si (KR); Jun Won Choi, Seoul (KR); Su Jin Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 221 days.

(21) Appl. No.: 16/919,382

(22) Filed: Jul. 2, 2020

(65) Prior Publication Data

US 2021/0143241 A1    May 13, 2021

(30) Foreign Application Priority Data

Nov. 11, 2019    (KR) .......................... 10-2019-0143721

(51) Int. Cl.
*H01L 27/32* (2006.01)
*H01L 51/52* (2006.01)

(52) U.S. Cl.
CPC ...... *H01L 27/3272* (2013.01); *H01L 27/3276* (2013.01)

(58) Field of Classification Search
CPC ....... H01L 51/52; H01L 27/12; H01L 27/124; H01L 27/1255; H01L 27/32;
(Continued)

(56) References Cited

U.S. PATENT DOCUMENTS

2017/0358605 A1* 12/2017 Choi .................. H01L 27/1255
2018/0212016 A1*  7/2018 Choi .................. H01L 27/3276

FOREIGN PATENT DOCUMENTS

CN       110335564       10/2019
KR    1020060025883       3/2006
(Continued)

OTHER PUBLICATIONS

Extended European Search Report—European Application No. 20206536.3 dated Apr. 6, 2021, citing references listed within.

*Primary Examiner* — Fazli Erdem
(74) *Attorney, Agent, or Firm* — Cantor Colburn LLP

(57) ABSTRACT

A display device includes a substrate, data lines arranged on the substrate, the data lines to which data voltages are applied, scan lines arranged on the substrate, the scan lines to which scan signals are applied, and a pixel connected to one of the data lines and at least one of the scan lines. The pixel includes a light emitting element, a driving transistor which supplies a driving current flowing between a first electrode and a second electrode to the light emitting element in accordance with the data voltage of the data line applied to a gate electrode, a first transistor between the gate electrode and second electrode of the driving transistor, a shielding electrode overlapping at least a part of the first transistor in a thickness direction of the substrate. The shielding electrode does not overlap the data lines in the thickness direction of the substrate.

26 Claims, 28 Drawing Sheets

(58) Field of Classification Search
CPC ............... H01L 27/327; H01L 27/3272; H01L 27/3276; G09F 9/33; G09G 3/32
USPC ......................................................... 257/72
See application file for complete search history.

(56) References Cited

FOREIGN PATENT DOCUMENTS

| | | |
|---|---|---|
| KR | 1020140108023 | 9/2014 |
| KR | 1020140127047 | 11/2014 |
| KR | 1020170090559 | 8/2017 |

* cited by examiner

DISPLAY DEVICE

This application claims priority to Korean Patent Application No. 10-2019-0143721 filed on Nov. 11, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

With a development of information society, demands for display devices for displaying images have increased in various forms. The display devices are applied to various electronic appliances such as smart phones, digital cameras, notebook computers, navigators, and smart televisions. The display devices include a flat panel display device such as a liquid crystal display device, a field emission display device, or a light emitting display device.

Since the light emitting display device includes pixels respectively including light emitting elements which emit light by themselves, it may display an image without a backlight unit providing light to the display panel. Each of the pixels in the light emitting display device may include the light emitting element, a driving transistor for adjusting an amount of a driving current supplied from a driving voltage line to the light emitting element according to a data voltage applied to a gate electrode through a data line, and a plurality of switching transistors turned-on in response to a scan signal of a scan line.

SUMMARY

Among a plurality of switching transistors, a switching transistor disposed adjacent to the data line may be influenced by a voltage change of the data line.

Exemplary embodiments of the invention provide a display device capable of preventing a switching transistor adjacent to a data line from being influenced by a voltage change of the data line or reducing the influence.

An exemplary embodiment of the invention provides a display device including a substrate, data lines arranged on the substrate, the data lines to which data voltages are applied, scan lines arranged on the substrate, the scan lines to which scan signals are applied, and a pixel connected to a data line of the data lines and at least one scan line of the scan lines. The pixel includes a light emitting element, a driving transistor which includes a gate electrode, a first electrode and a second electrode and supplies a driving current flowing between the first electrode and the second electrode to the light emitting element in accordance with the data voltage of the data line applied to the gate electrode, a first transistor between the gate electrode and second electrode of the driving transistor, a shielding electrode overlapping at least a part of the first transistor in a thickness direction of the substrate. The shielding electrode does not overlap the data lines in the thickness direction of the substrate.

An exemplary embodiment of the invention provides a display device including a substrate, a light emitting element, a driving transistor which includes a gate electrode, a first electrode and a second electrode and supplies a driving current flowing between the first electrode and the second electrode to the light emitting element in accordance with a data voltage of a data line applied to the gate electrode, a first transistor disposed adjacent to another data line adjacent to the data line, and a shielding electrode overlapping at least a part of the first transistor in a thickness direction of the substrate. The shielding electrode does not overlap the another data line.

BRIEF DESCRIPTION OF THE DRAWINGS

These and/or other features of the invention will become apparent and more readily appreciated from the following description of the exemplary embodiments, taken in conjunction with the accompanying drawings, in which.

DETAILED DESCRIPTION

Figure 1:
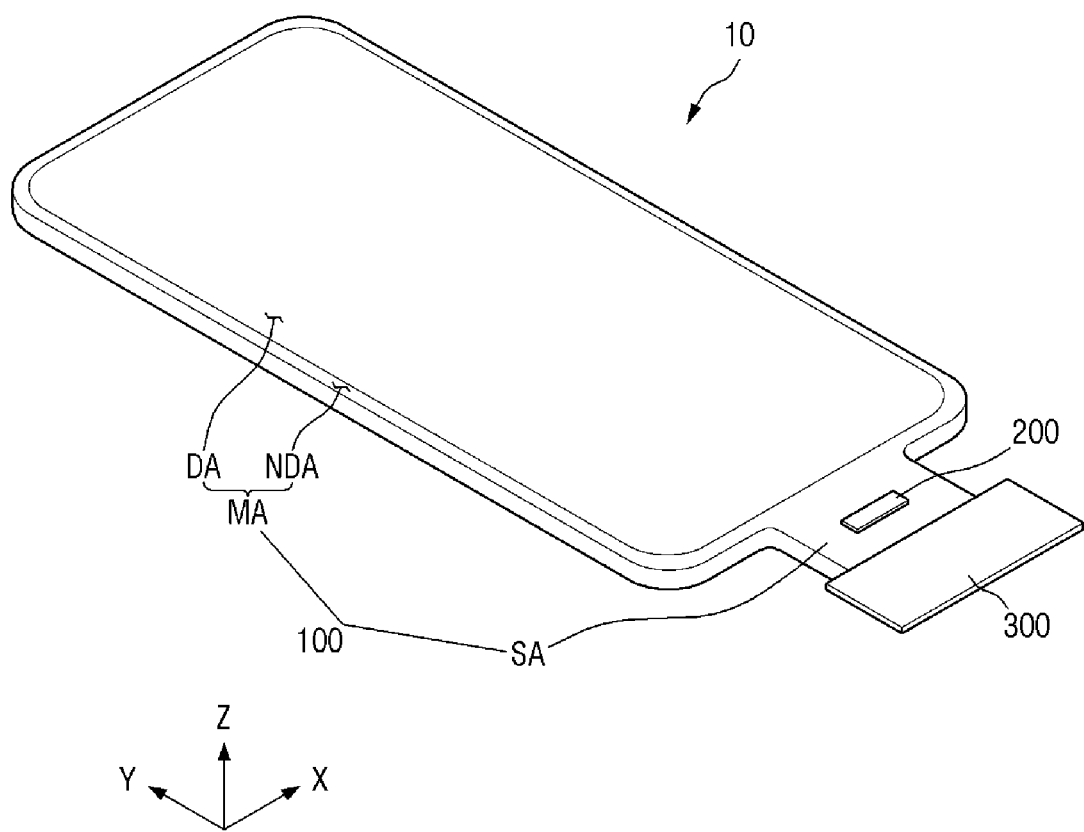
FIG. 1 is a perspective view of an exemplary embodiment of a display device.

Exemplary embodiments of the invention will now be described more fully hereinafter with reference to the accompanying drawings, in which preferred embodiments of the invention are shown. The invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or non-linear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
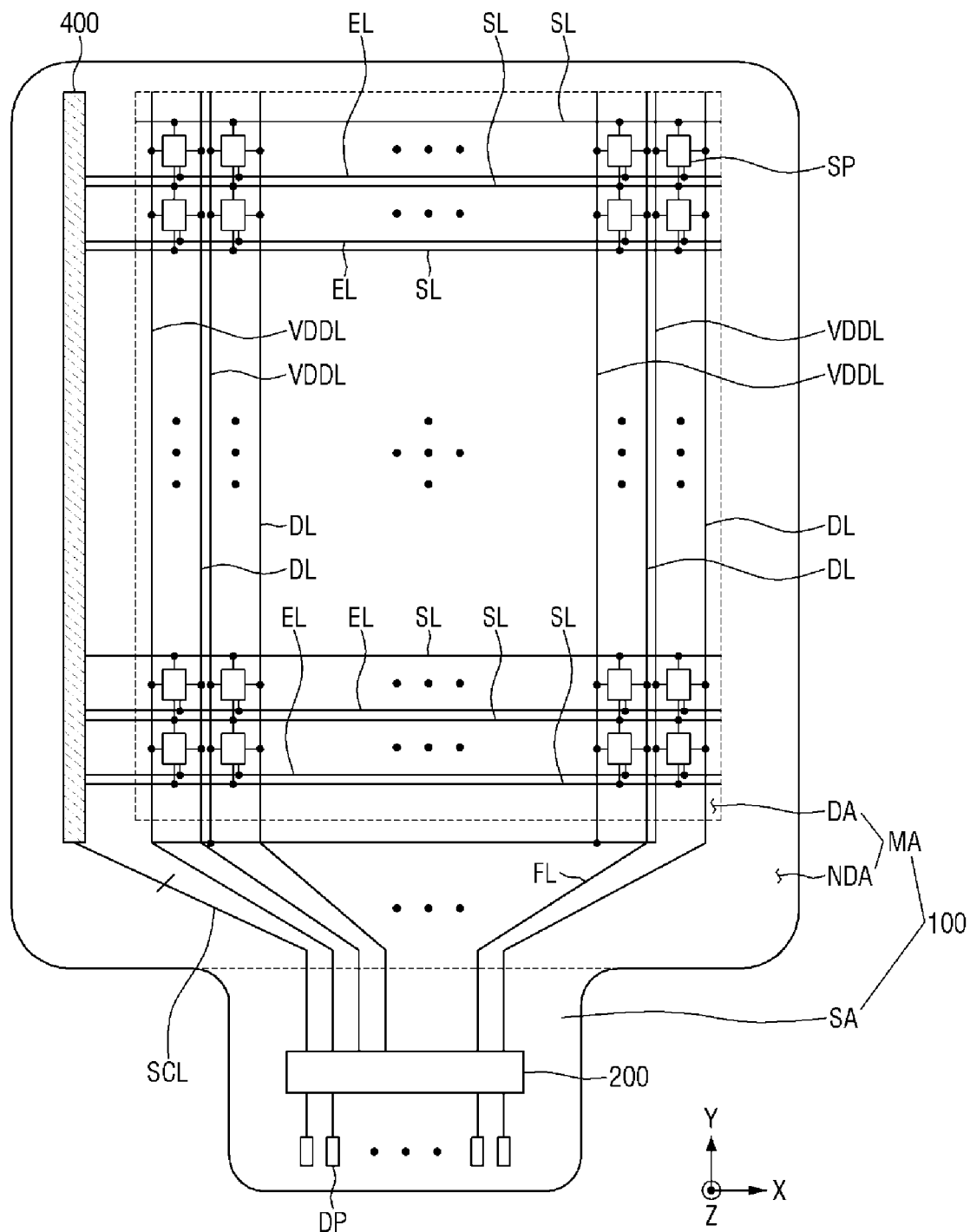
FIG. 2 is a plan view of a display device.
Figure 3:
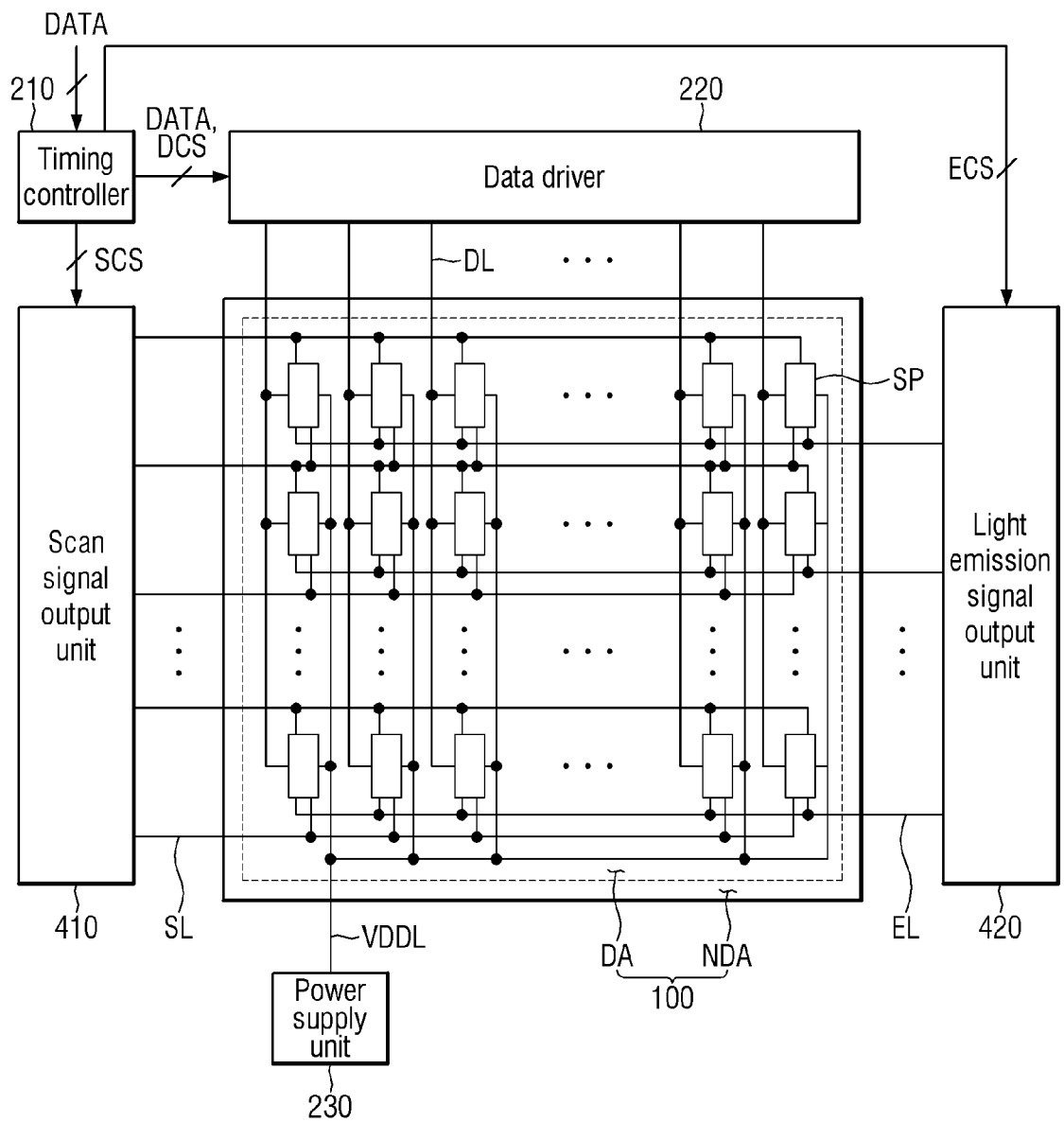
FIG. 3 is a block diagram of an exemplary embodiment of a display device.

FIG. 1 is a perspective view of an exemplary embodiment of a display device, FIG. 2 is a plan view of an exemplary embodiment of a display device, and FIG. 3 is a block diagram of an exemplary embodiment of a display device.

In this specification, the first direction (X-axis direction) may be a direction parallel to the short side of a display device 10 in a plan view, for example, a horizontal direction of the display device 10. The second direction (Y-axis direction) may be a direction parallel to the long side of the display device 10 in a plan view, for example, a vertical direction of the display device 10. The third direction (Z-axis direction) may be thickness direction of a display panel 100.

Referring to FIGS. 1 to 3, a display device 10, which is a device for displaying a moving image or a still image, may be used as a display screen of various products such as televisions, notebooks, monitors, billboards, internet of things ("IOTs") as well as portable electronic appliances such as mobile phones, smart phones, tablet personal computers (tablet "PCs"), smart watches, watch phones, mobile communication terminals, electronic notebooks, electronic books, portable multimedia players ("PMPs"), navigators, and ultra mobile PCs ("UMPCs").

The display device 10 may be alight emitting display device such as an organic light emitting display device using an organic light emitting diode ("OLED"), a quantum dot light emitting display device including a quantum dot light emitting layer, an inorganic light emitting display device including an inorganic semiconductor, or a micro light emitting display device using a micro light emitting diode (micro "LED"). Hereinafter, the display device 10 will be mainly described as an organic light emitting display device, but the invention is not limited thereto.

The display device 10 includes a display panel 100, a display driving circuit 200, and a circuit board 300.

The display panel 100 may have a rectangular planar shape having short sides in the first direction (X-axis direction) and long sides in the second direction (Y-axis direction). The corner where the short side in the first direction (X-axis direction) meets the long side in the second direction (Y-axis direction) may have a round shape of a predetermined curvature or have a right angle shape. The planar shape of the display panel 100 is not limited to a rectangular shape, and may be provided in another polygonal shape, circular shape, or elliptical shape. The display panel 100 may be flat, but the invention is not limited thereto. In an exemplary embodiment, the display panel 100 may include a curved portion provided at the left and right ends thereof and having a constant curvature or a variable curvature, for example. In addition, the display panel 100 may be flexible to be bent, warped, folded, or rolled.

The display panel 100 may include a main area MA and a sub-area SA. The main area MA may include a display area DA in which sub-pixels SP display an image, and a non-display area NDA which is a peripheral area of the display area DA. The display area DA may be provided with scan lines SL, light emitting lines EL, data lines DL, and first driving voltage lines VDDL, which are connected to the sub-pixels SP, in addition to the sub-pixels SP.

The scan lines SL and the light emitting lines EL may be arranged in parallel in the first direction (X-axis direction). The data lines DL may be arranged in parallel in the second direction (Y-axis Direction) crossing the first direction (X-axis direction).

The first driving voltage lines VDDL may extend in parallel in the second direction (Y-axis direction) in the display area DA. The first driving voltage lines VDDL extending in parallel in the second direction (Y-axis direction) in the display area DA may be connected to each other in the non-display area NDA. In an alternative exemplary embodiment, the first driving voltage lines VDDL may include first sub-driving voltage lines provided in parallel in the second direction (Y-axis direction) in the display area DA, and second sub-driving voltage lines provided in parallel in the first direction (X-axis direction) in the display area DA.

Each of the sub-pixels SP may be connected to at least one of the scan lines SL, at least one of the data lines DL, at least one of the light emitting lines EL, and the first driving voltage line VDDL. Although it is shown in FIG. 2 that each of the sub-pixels SP is connected to two scan lines SL, one data line DL, one light emitting line EL, and the first driving voltage line VDDL, the invention is not limited thereto, and each of the sub-pixels SP may be connected to three scan lines SL, for example, not two scan lines SL.

Each of the sub-pixels SP may include a driving transistor, at least one transistor, a light emitting element, and a capacitor. The transistor is turned on when a scan signal is applied from the scan line SL, and thus a data voltage of the data line DL may be applied to a gate electrode of the driving transistor DT (refer to FIG. 4). The driving transistor DT may supply a driving current to the light emitting element in accordance with the data voltage applied to the gate electrode, thereby emitting light. The driving transistor DT and the at least one transistor ST1, ST2, ST3, ST4, ST5, ST6 (refer to FIG. 4) may be thin film transistors ("TFTs"). The light emitting element may emit light in accordance with the driving current of the driving transistor DT. The light emitting element may be an OLED including a first electrode, an organic light emitting layer, and a second electrode. The capacitor may serve to keep the data voltage applied to the gate electrode of the driving transistor DT constant.

The non-display area NDA may be defined as an area from the outside of the display area DA to the edge of the display panel 100. The non-display area NDA may be provided with a scan driver 400 for applying scan signals to the scan lines SL, fan-out lines FL between the data lines DL and the display driving circuit 200, and pads DP connected to the display driving circuit 200. The display driving circuit 200 and the pads DP may be disposed at one side edge of the display panel 100. The pads DP may be disposed adjacent to one side edge of the display panel 100 rather than the display driving circuit 200.

The sub-area SA may protrude from one side of the main area MA in the second direction (Y-axis direction). As shown in FIG. 2, the length of the sub-area SA in the first direction (X-axis direction) may be smaller than the length of the main area MA in the first direction (X-axis direction), and the length of the sub-area SA in the second direction (Y-axis direction) may be smaller than the length of the main area MA in the second direction (Y-axis direction), but the invention is not limited thereto.

The sub-area SA may be bent, and may be disposed on the lower surface of the display panel 100. The sub-area SA may overlap the main area MA in the thickness direction (Z-axis direction) of a substrate. The pads DP and the display driving circuit 200 may be arranged in the sub-area SA.

The scan driver 400 may be connected to the display driving circuit 200 through a plurality of scan control lines SCL. The scan driver 400 may receive a scan control signal SCS and a light emission control signal ECS from the display driving circuit 200 through the plurality of scan control lines SCL.

As shown in FIG. 3, the scan driver 400 may include a scan signal output unit 410 and a light emission signal output unit 420. The scan signal output unit 410 may generate scan signals according to the scan control signal SCS, and may sequentially output the scan signals to the scan lines SL. The light emission signal output unit 420 may generate light emission control signals according to the light emission control signal ECS, and may sequentially output the light emission control signals to the light emitting lines EL.

The scan driver 400 may include a plurality of TFTs. The scan driver 400 may be disposed in the same layer as the TFTs of the sub-pixels SP. In an alternative exemplary embodiment, the scan driver 400 may be disposed in the different layer from the TFTs of the sub-pixels SP.

Although it is shown in FIG. 2 that the scan driver 400 is disposed in the non-display area NDA disposed at one side, e.g., left side of the display area DA, the invention is not limited thereto. In an exemplary embodiment, the scan driver 400 may be disposed in the non-display area NDA disposed at both sides, e.g., left and right sides of the display area DA, for example.

In an exemplary embodiment, the display driving circuit 200 may be provided as an integrated circuit ("IC"), and may be attached onto the display panel 100 by a chip on glass ("COG") method, a chip on plastic ("COP") method, or an ultrasonic bonding method. However, the invention is not limited thereto. In an exemplary embodiment, the display driving circuit 200 may be attached onto the circuit board 300 by the COG method, for example. As shown in FIG. 3, the display driving circuit 200 may include a timing controller 210, a data driver 220, and a power supply unit 230.

The timing controller 210 receives digital video data and timing signals from the circuit board 300. The timing controller 210 may generate a scan control signal SCS for controlling the operation timing of the scan signal output unit 410 according to the timing signals, may generate a light emission control signal ECS for controlling the operation timing of the light emission signal output unit 420, and may generate a data control signal DCS for controlling the operation timing of the data driver 220. The timing controller 210 may output the scan control signal SCS to the scan signal output unit 410 through the plurality of scan control lines SCL, and may output the light emission control signal ECS to the light emission signal output unit 420. The timing controller 210 may output the digital video data DATA and the data control signal DCS to the data driver 220.

The data driver 220 converts the digital video data DATA into analog positive polarity and negative polarity data voltages and outputs these data voltages to the data lines DL through the fan-out lines FL. The sub-pixels SP are selected by the scan signals of the scan driver 400, and the data voltages are supplied to the selected sub-pixels SP.

The power supply unit 230 may generate a first driving voltage and supply the first driving voltage to the first driving voltage line VDDL. Further, the power supply unit 230 may generate a second driving voltage and supply the second driving voltage to a cathode electrode of the OLEDs of each of the sub-pixels SP. The first driving voltage may be a high-potential voltage for driving the OLED, and the second driving voltage may be a low-potential voltage for driving the OLED. That is, the first driving voltage may have a higher potential than the second driving voltage.

The circuit board 300 may be attached onto the pads DP using an anisotropic conductive film. Thus, lead lines of the circuit board 300 may be electrically connected to the pads DP. In an exemplary embodiment, the circuit board 300 may be a flexible film such as a flexible printed circuit board, a printed circuit board, or a chip on film.

Figure 4:
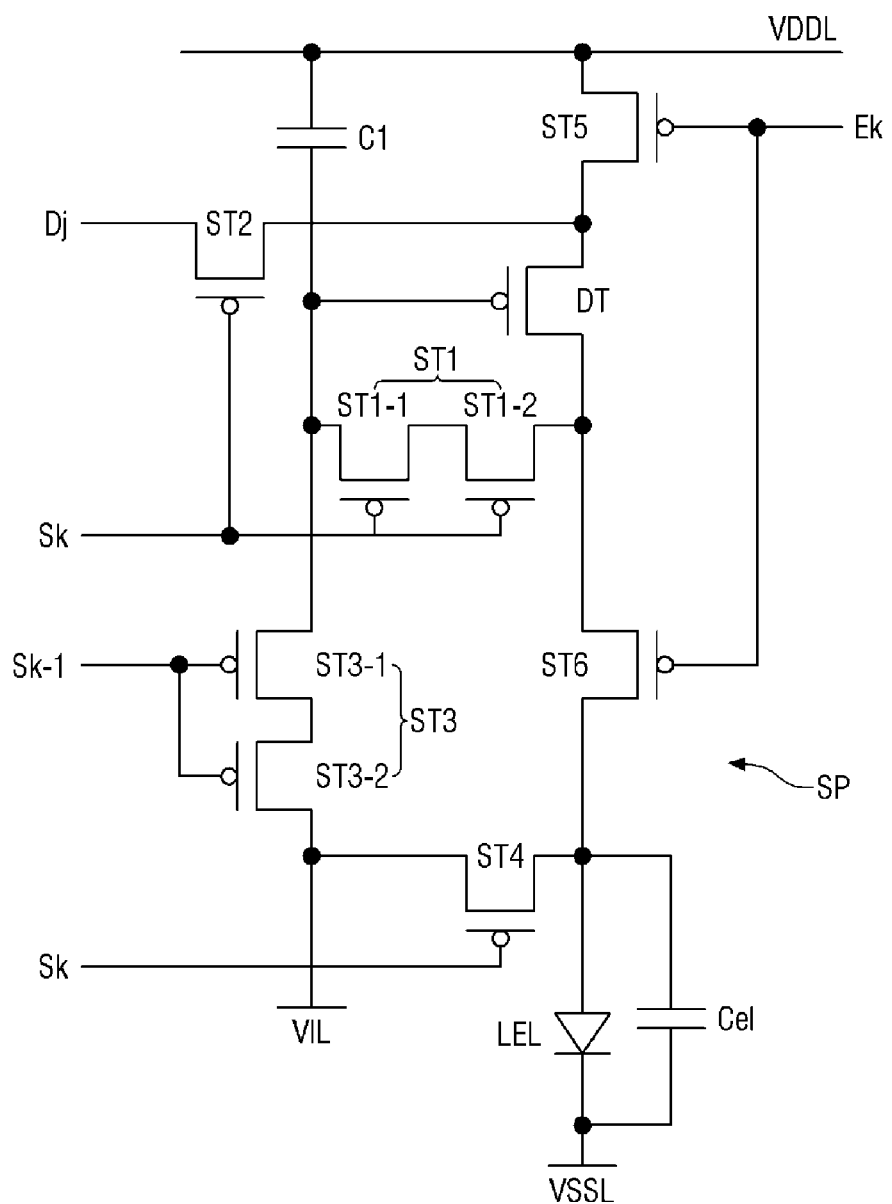
FIG. 4 is a detailed circuit diagram of an exemplary embodiment of a sub-pixel.

FIG. 4 is a detailed circuit diagram of an exemplary embodiment of a sub-pixel.

Referring to FIG. 4, the sub-pixel SP may be connected to a k−1$_{th}$ (k is an integer equal to or greater than 2) scan line Sk−1, a k$_{th}$ scan line Sk, and a j$_{th}$ (j is a positive integer) data line Dj. Further, the sub-pixel SP may be connected to a first driving voltage line VDDL for supplying a first driving voltage, an initialization voltage line VIL for supplying an initialization voltage, and a second driving voltage line VSSL for supplying a second driving voltage.

The sub-pixel SP includes a driving transistor DT, a light emitting element LEL, switch elements, and a capacitor C1. The switch elements include first to sixth transistors ST1, ST2, ST3, ST4, ST5, and ST6.

The driving transistor DT may include agate electrode, a first electrode, and a second electrode.

The driving transistor DT controls a drain-source current Ids (hereinafter referred to as "driving current") flowing between the first electrode and the second electrode according to the data voltage applied to the gate electrode. The driving current Ids flowing through the channel of the driving transistor DT is proportional to a square of a difference between a gate-source voltage Vgs and a threshold voltage Vth of the driving transistor DT as shown in Equation 1 below.

$$Ids \propto k' \times (Vgs - Vth)^2 \quad \text{[Equation 1]}$$

In Equation 1, k' is a proportional coefficient determined by the structure and physical characteristics of the driving transistor DT, Vgs is a gate-source voltage of the driving transistor DT, and Vth is a threshold voltage of driving transistor DT.

The light emitting element LEL emits light in accordance with the driving current Ids. The light emission amount of the light emitting element LEL may be proportional to the drive current Ids.

The light emitting element LEL may be an OLED including an anode electrode, a cathode electrode, and an organic light emitting layer disposed between the anode electrode and the cathode electrode. In an alternative exemplary embodiment, the light emitting element LEL may be an inorganic light emitting element including an anode electrode, a cathode electrode, and an inorganic semiconductor disposed between the anode electrode and the cathode electrode. In an alternative exemplary embodiment, the light emitting element LEL may be a quantum dot light emitting element including an anode electrode, a cathode electrode, and a quantum dot light emitting layer disposed between the anode electrode and the cathode electrode. In an alternative exemplary embodiment, the light emitting element LEL may be a micro LED.

The anode electrode of the light emitting element LEL may be connected to the first electrode of the fourth transistor ST4 and the second electrode of the sixth transistor ST6, and the cathode electrode thereof may be connected to the second driving voltage line VSSL. A parasitic capacitance Cel may be provided between the anode electrode and cathode electrode of the light emitting element LEL.

The first transistor ST1 may be a dual transistor including a (1-1)th transistor ST1-1 and a (1-2)th transistor ST1-2. The (1-1)th transistor ST1-1 and the (1-2)th transistor ST1-2 are turned on by the scan signal of the k$_{th}$ scan line Sk to connect the gate electrode and second electrode of the driving transistor DT. That is, when the (1-1)th transistor ST1-1 and the (1-2)th transistor ST1-2 are turned on, the gate electrode and second electrode of the driving transistor DT are connected to each other, the driving transistor DT is driven as a diode. The gate electrode of the (1-1)th transistor ST1-1 may be connected to the k$_{th}$ scan line Sk, the first electrode thereof may be connected to the second electrode of the (1-2)th transistor ST1-2, and the second electrode thereof may be connected to the gate electrode of the driving transistor DT. The gate electrode of the (1-2)th transistor ST1-2 may be connected to the k$_{th}$ scan line Sk, the first electrode thereof may be connected to the second electrode of the driving transistor DT, and the second electrode thereof may be connected to the first electrode of the (1-1)th transistor ST1-1.

The second transistor ST2 is turned on by the scan signal of the k$_{th}$ scan line Sk to connect the first electrode of the driving transistor DT to the j$_{th}$ data line Dj. The gate electrode of the second transistor ST2 may be connected to the k$_{th}$ scan line Sk, the first electrode thereof may be connected to the first electrode of the driving transistor DT, and the second electrode thereof may be connected to the j$_{th}$ data line Dj.

The third transistor ST3 may be a dual transistor including a (3-1)th transistor ST3-1 and a (3-2)th transistor ST3-2. The (3-1)th transistor ST3-1 and the (3-2)th transistor ST3-2 are turned on by the scan signal of the k−1$_{th}$ scan line Sk−1 to connect the gate electrode of the driving transistor DT to an initialization voltage line VIL. The gate electrode of the driving transistor DT may be discharged to an initialization voltage of the initialization voltage line VIL. The gate electrode of the (3-1)th transistor ST3-1 may be connected to the k−1$_{th}$ scan line Sk−1, the first electrode thereof may be connected to the gate electrode of the driving transistor DT, and the second electrode thereof may be connected to the first electrode of the (3-2)th transistor ST3-2. The gate electrode of the (3-2)th transistor ST3-2 may be connected to the k−1$_{th}$ scan line Sk−1, the first electrode thereof may be connected to the second electrode of the (3-1)th transistor ST3-1, and the second electrode thereof may be connected to the initialization voltage line VIL.

The fourth transistor ST4 is turned on by the scan signal of the k$_{th}$ scan line Sk to connect the anode electrode of the light emitting element LEL to the initialization voltage line VIL. The anode electrode of the light emitting element LEL may be discharged to an initialization voltage of the initialization voltage line VIL. The gate electrode of the fourth transistor ST4 may be connected to the k$_{th}$ scan line Sk, the first electrode thereof may be connected to the anode electrode of the light emitting element LEL, and the second electrode thereof may be connected to the initialization voltage line VIL.

The fifth transistor ST5 is turned on by a light emission control signal of the $k_{th}$ light emission control line Ek to connect the first electrode of the driving transistor DT to the first driving voltage line VDDL. The gate electrode of the fifth transistor ST5 is connected to the $k_{th}$ light emission control line Ek, the first electrode thereof is connected to the first driving voltage line VDDL, and the second electrode thereof is connected to the first electrode of the driving transistor DT.

The sixth transistor ST6 is connected between the second electrode of the driving transistor DT and the anode electrode of the light emitting element LEL. The sixth transistor ST6 is turned on by a light emission control signal of the $k_{th}$ light emission control line Ek to connect the second electrode of the driving transistor DT to the anode electrode of the light emitting element LEL. The gate electrode of the sixth transistor ST6 is connected to the $k_{th}$ light emission control line Ek, the first electrode thereof is connected to the second electrode of the driving transistor DT, and the second electrode thereof is connected to the anode electrode of the light emitting element LEL. When both the fifth transistor ST5 and the sixth transistor ST6 are turned on, the driving current Ids may be supplied to the light emitting element LEL.

The capacitor C1 is provided between the gate electrode of the driving transistor DT and the first driving voltage line VDDL. One electrode of the capacitor C1 may be connected to the gate electrode of the driving transistor DT, and the other electrode thereof may be connected to the first driving voltage line VDDL.

When the first electrode of each of the first to sixth transistors ST1, ST2, ST3, ST4, ST5, and ST6 and the driving transistor DT is a source electrode, the second electrode thereof may be a drain electrode. In an alternative exemplary embodiment, when the first electrode of each of the first to sixth transistors ST1, ST2, ST3, ST4, ST5, and ST6 and the driving transistor DT is a drain electrode, the second electrode thereof may be a source electrode.

The active layer of each of the first to sixth transistors ST1, ST2, ST3, ST4, ST5, and ST6 and the driving transistor DT may include any one of polysilicon, amorphous silicon, and an oxide semiconductor. When the active layer of each of the first to sixth transistors ST1, ST2, ST3, ST4, ST5, and ST6 and the driving transistor DT may include polysilicon, the process of forming the active layer may be a low-temperature polysilicon ("LTPS") process, for example.

Although it is mainly described in FIG. 4 that the first to sixth transistors ST1, ST2, ST3, ST4, ST5, and ST6 and the driving transistor DT include P-type metal oxide semiconductor field effect transistors ("MOSFETs"), the invention is not limited thereto, and they may include N-type MOSFETs.

The first driving voltage of the first driving voltage line VDDL, the second driving voltage of the second driving voltage line VSSL, and the initialization voltage of the initialization voltage line VIL may be set in consideration of the characteristics of the driving transistor DT and the characteristics of the light emitting element LEL. In an exemplary embodiment, a voltage difference between the initialization voltage and the data voltage supplied to the first electrode of the driving transistor DT may be set to be smaller than the threshold voltage of driving transistor DT, for example.

Figure 5:
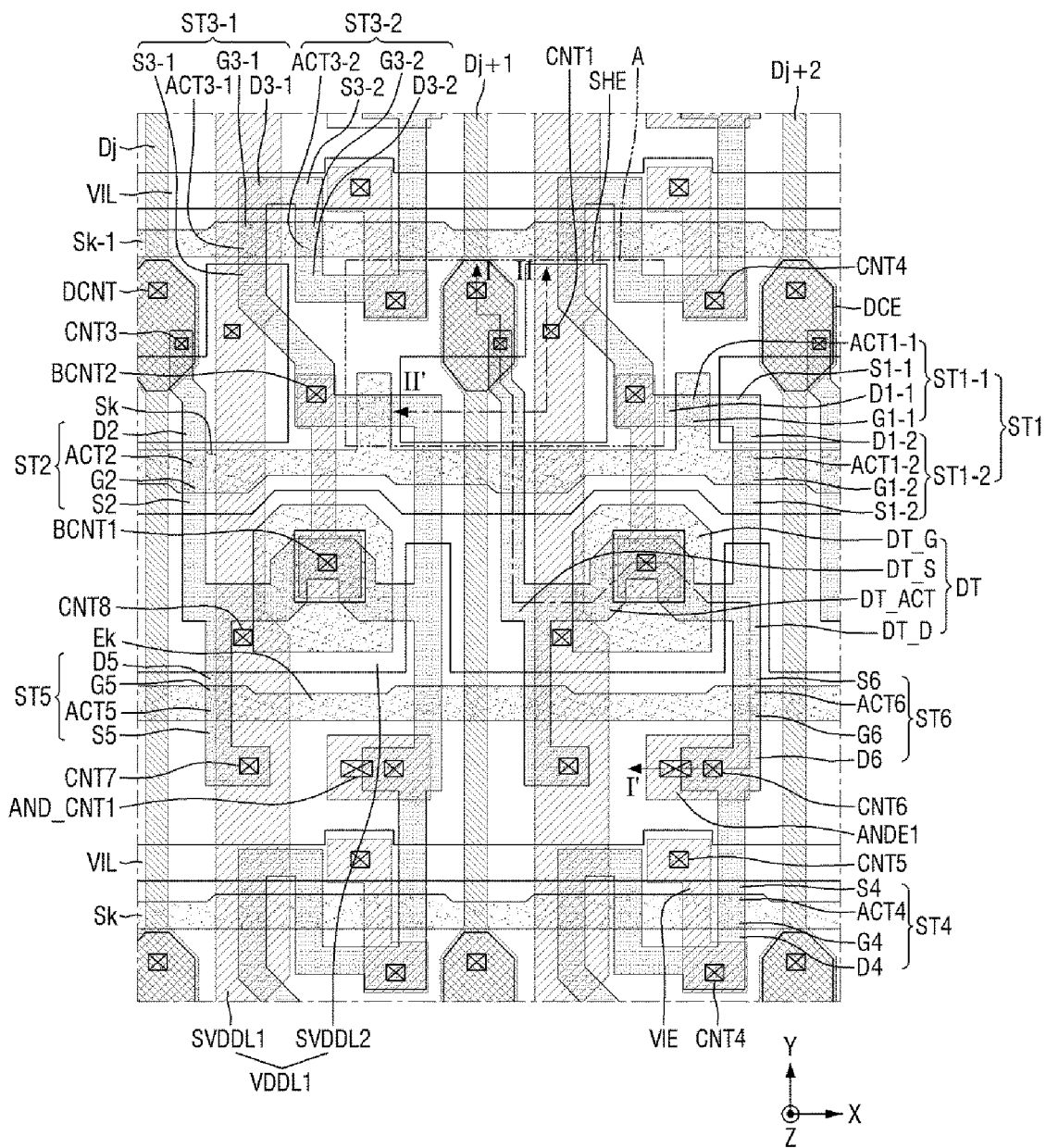
FIG. 5 is a detailed plan view of an exemplary embodiment of a sub-pixel.
Figure 6:
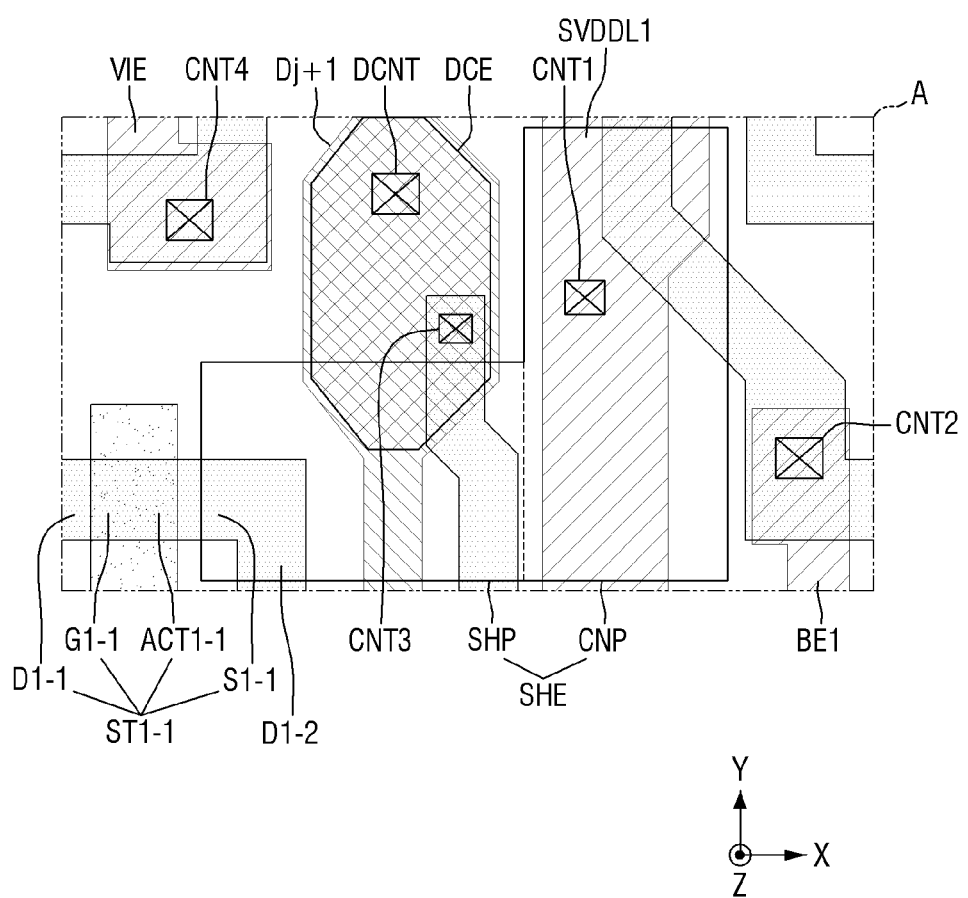
FIG. 6 is a detailed plan view of the area A of FIG. 5.

FIG. 5 is a detailed plan view of an exemplary embodiment of a sub-pixel, and FIG. 6 is a detailed plan view of the area A of FIG. 5.

Referring to FIGS. 5 and 6, the sub-pixel SP may include a driving transistor DT, first to sixth transistors ST1 to ST6, a capacitor C1, a first connection electrode BET, a second connection electrode VIE, a data connection electrode DCE, and a shielding electrode SHE.

The sub-pixel SP may overlap the $k-1_{th}$ scan line Sk−1, the $k_{th}$ scan line Sk, the $k_{th}$ light emission control line Ek, the $j_{th}$ data line Dj, the first driving voltage line VDDL1, and the initialization voltage line VIL in the third direction (Z-axis direction). The sub-pixel SP may be connected to the $k-1_{th}$ scan line Sk−1, the $k_{th}$ scan line Sk, the $j_{th}$ data line Dj, and the first driving voltage line VDDL1 through the first to sixth transistors ST1 to ST6. The k−1,m scan line Sk−1, the $k_{th}$ scan line Sk, the $k_{th}$ light emission control line Ek, and the initialization voltage line VIL may extend in the first direction (X-axis direction). The $j_{th}$ data line Dj may extend in the second direction (Y-axis direction).

The first driving voltage line VDDL1 may include a first sub-driving voltage line SVDDL1 and a second sub-driving voltage line SVDDL2. The first sub-driving voltage line SVDDL1 may extend in the second direction (Y-axis direction), and the second sub-driving voltage line SVDDL2 may extend in the first direction (X-axis direction). The first sub-driving voltage line SVDDL1 may be disposed between the $j_{th}$ data line Dj and the first connection electrode BET in the first direction (X-axis direction). The second sub-driving voltage line SVDDL2 may be disposed between the $k_{th}$ scan line Sk and the $k_{th}$ light emission control line Ek in the second direction (Y-axis direction). The first sub-driving voltage line SVDDL1 may be connected to the second sub-driving voltage line SVDDL2 through the eighth contact hole CNT8.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT in the third direction (Z-axis direction). The gate electrode DT_G may be disposed on the active layer DT_ACT of the driving transistor DT.

The gate electrode DT_G may be connected to the first connection electrode BET through the first connection contact hole BCNT1. The first connection electrode BET may be connected to the second electrode D1-1 of the (1-1)th transistor ST1-1 through the second connection contact hole BCNT2. Since the first connection electrode BET extends in the second direction (Y-axis direction), the first connection electrode BET may cross the $k_{th}$ scan line Sk.

The first electrode DT_S of the driving transistor DT may be connected to the first electrode S2 of the second transistor ST2. The second electrode DT_D of the driving transistor DT may be connected to the first electrode S1-2 of the (1-2)th transistor ST1-2 and the first electrode S6 of the sixth transistor ST6.

The first transistor ST1 may be provided as a dual transistor. The first transistor ST1 may include a (1-1)th transistor ST1-1 and a (1-2)th transistor ST1-2.

The (1-1)th transistor ST1-1 may include an active layer ACT1-1, a gate electrode GT-1, a first electrode S1-1, and a second electrode D1-1. The gate electrode GT-1 of the (1-1)th transistor ST1-1 is a part of the $k_{th}$ scan line Sk, and may be an overlapping region of the active layer ACT1-1 of the (1-1)th transistor ST1-1 and the $k_{th}$ scan line Sk in the third direction (Z-axis direction). The first electrode S1-1 of the (1-1)th transistor ST1-1 may be connected to the second electrode D1-2 of the (1-2)th transistor ST1-2. The second electrode D1-1 of the (1-1)th transistor ST1-1 may be connected to the first connection electrode BE1 through the second connection contact hole BCNT2.

The (1-2)th transistor ST1-2 may include an active layer ACT1-2, a gate electrode G1-2, a first electrode S1-2, and a second electrode D1-2. The gate electrode G1-2 of the (1-2)th transistor ST1-2 is a part of the $k_{th}$ scan line Sk, and may be an overlapping region of the active layer ACT1-2 of the (1-2)th transistor ST1-2 and the $k_{th}$ scan line Sk in the third direction (Z-axis direction). The first electrode S1-2 of the (1-2)th transistor ST1-2 may be connected to the second electrode DT_D of the driving transistor DT. The second electrode D1-2 of the (1-2)th transistor ST1-2 may be connected to the first electrode S1-1 of the (1-1)th transistor ST1-1.

The second transistor ST2 may include an active layer ACT2, a gate electrode G2, a first electrode S2, and a second electrode D2. The gate electrode G2 of the second transistor ST2 is a part of the $k_{th}$ scan line Sk, and may be an overlapping region of the active layer ACT2 of the second transistor ST2 and the $k_{th}$ scan line Sk in the third direction (Z-axis direction). The first electrode S2 of the second transistor ST2 may be connected to the first electrode DT_S of the driving transistor DT. The second electrode D2 of the second transistor ST2 may be connected to the data connection electrode DCE through the third contact hole CNT3. The data connection electrode DCE may be connected to the $j_{th}$ data line Dj through the data contact hole DCNT.

The third transistor ST3 may be provided as a dual transistor. The third transistor ST3 may include a (3-1)th transistor ST3-1 and a (3-2)th transistor ST3-2.

The (3-1)th transistor ST3-1 may include an active layer ACT3-1, a gate electrode G3-1, a first electrode S3-1, and a second electrode D3-1. The gate electrode G3-1 of the (3-1)th transistor ST3-1 is a part of the $k-1_{th}$ scan line Sk−1, and may be an overlapping region of the active layer ACT3-1 of the (3-1)th transistor ST3-1 and the $k-1_{th}$ scan line Sk−1. The first electrode S3-1 of the (3-1)th transistor ST3-1 may be connected to the first connection electrode BE1 through the second connection contact hole BCNT2. The second electrode D3-1 of the (3-1)th transistor ST3-1 may be connected to the first electrode S3-2 of the (3-2)th transistor ST3-2.

The (3-2)th transistor ST3-2 may include an active layer ACT3-2, a gate electrode G3-2, a first electrode S3-2, and a second electrode D3-2. The gate electrode G3-2 of the (3-2)th transistor ST3-2 is a part of the $k-1_{th}$ scan line Sk−1, and may be an overlapping region of the active layer ACT3-2 of the (3-2)th transistor ST3-2 and the $k-1_{th}$ scan line Sk−1. The first electrode S3-2 of the (3-2)th transistor ST3-2 may be connected to the second electrode D3-1 of the (3-1)th transistor ST3-1. The second electrode D3-2 of the (3-2)th transistor ST3-2 may be connected to the second connection electrode VIE through the fourth contact hole CNT4.

The fourth transistor ST4 may include an active layer ACT4, a gate electrode G4, a first electrode S4, and a second electrode D4. The gate electrode G4 of the fourth transistor ST4 is a part of the $k_{th}$ scan line Sk, and may be an overlapping region of the active layer ACT4 of the fourth transistor ST4 and the $k_{th}$ scan line Sk. The first electrode S4 of the fourth transistor ST4 may be connected to the first anode connection electrode ANDE1 through the sixth contact hole CNT6. The anode electrode of the light emitting element may be connected to the first anode connection electrode ANDE1 through the second anode connection electrode ANDE2 (see FIG. 7). The second electrode D4 of the fourth transistor ST4 may be connected to the second connection electrode VIE through the fourth contact hole CNT4. The initialization voltage line VIL may be connected to the second connection electrode VIE through the fifth contact hole CNT5, and the second connection electrode VIE may be connected to the second electrode D3-2 of the (3-2)th transistor ST3-2 and the second electrode D4 of the fourth transistor ST4 through the fourth contact hole CNT4. The second connection electrode VIE may extend in the second direction (Y-axis direction), and may intersect the $k-1_{th}$ scan line Sk−1.

The fifth transistor ST5 may include an active layer ACT5, a gate electrode G5, a first electrode S5, and a second electrode D5. The gate electrode G5 of the fifth transistor ST5 is a part of the $k_{th}$ light emission control line Ek, and may be an overlapping region of the active layer ACT5 of the fifth transistor ST5 and $k_{th}$ light emission control line Ek. The first electrode S5 of the fifth transistor ST5 may be connected to the first sub-driving voltage line SVDDL1 through the seventh contact hole CNT7. The second electrode D5 of the fifth transistor ST5 may be connected to the first electrode DT_S of the driving transistor DT.

The sixth transistor ST6 may include an active layer ACT6, a gate electrode G6, a first electrode S6, and a second electrode D6. The gate electrode G6 of the sixth transistor ST6 is a part of the $k_{th}$ light emission control line Ek, and may be an overlapping region of the active layer ACT6 of the sixth transistor ST6 and $k_{th}$ light emission control line Ek. The first electrode S6 of the sixth transistor ST6 may be connected to the second electrode DT_D of the driving transistor DT. The second electrode D6 of the sixth transistor ST6 may be connected to the first anode connection electrode ANDE1 through the sixth contact hole CNT6.

The first electrode of the capacitor C1 is a part of the gate electrode DT_G of the driving transistor DT, and the second electrode of the capacitor C1 may be the second sub-driving voltage line SVDDL2 overlapping the gate electrode DT_G of the driving transistor DT.

The shielding electrode SHE may overlap at least a part of the first transistor ST1 in the third direction (Z-axis direction). Among the first to sixth transistors ST1 to ST6, the first transistor ST1 may be disposed closest to the $j+1_{th}$ data line Dj+1.

Specifically, as shown in FIGS. 5 and 6, the first electrode S1-1 of the (1-1)th transistor ST1-1 and the second electrode D1-2 of the (1-2)th transistor ST1-2 may be disposed adjacent to the $j+1_{th}$ data line Dj+1. In this case, a parasitic capacitance may be provided between the first electrode S1-1 of the (1-1)th transistor ST1-1 and the $j+1_{th}$ data line Dj+1 and between the second electrode D1-2 of the (1-2)th transistor ST1-2 and the $j+1_{th}$ data line Dj+1. The parasitic capacitance may be a fringe capacitance. Due to the parasitic capacitance, the first electrode S1-1 of the (1-1)th transistor ST1-1 and the second electrode D1-2 of the (1-2)th transistor ST1-2 may be influenced by the data voltage transition of the $j+1_{th}$ data line Dj+1.

The shielding electrode SHE may overlap the first electrode S1-1 of the (1-1)th transistor ST1-1 and the second electrode D1-2 of the (1-2)th transistor ST1-2 in the third direction (Z-axis direction). Due to the shielding electrode SHE, the parasitic capacitance may be reduced. Therefore, the influence of the data voltage transition of the $j+1_{th}$ data line Dj+1 on the first electrode S1-1 of the (1-1)th transistor ST1-1 and the second electrode D1-2 of the (1-2)th transistor ST1-2 may be reduced.

The shielding electrode SHE may include a connection portion CNP and a shielding portion SHP. The connection portion CNP may be connected to the first sub-driving voltage line SVDDL1 adjacent to the $j+1_{th}$ data line Dj+1 in the first direction (X-axis direction). The connection portion CNP may be connected to the first sub-driving voltage line SVDDL1 through the first contact hole CNT1.

The connection portion CNP may overlap the first sub-driving voltage line SVDDL1 in the third direction (Z-axis direction). In the overlapping region of the first sub-driving voltage line SVDDL1 and the connection portion CNP, the length of the connection portion CNP in the first direction (X-axis direction) may be longer than the length of the first sub-driving voltage line SVDDL1 in the first direction (X-axis direction).

The connection portion CNP may extend in the second direction (Y-axis direction). One end of the connection portion CNP in the second direction (Y-axis direction) may be adjacent to the $k-1_{th}$ scan line Sk−1, and the other end of the connection portion CNP in the second direction (Y-axis direction) may be adjacent to the $k_{th}$ scan line Sk.

The shielding portion SHP may overlap at least a part of the first transistor ST1 in the third direction (Z-axis direction). The shielding portion SHP may overlap the first electrode S1-1 of the (1-1)th transistor ST1-1 and the second electrode D1-2 of the (1-2)th transistor ST1-2 in the third direction (Z-axis direction).

The shielding portion SHP may protrude from the connection portion CNP and extend in the first direction (X-axis direction). The shielding portion SHP may intersect the $j+1_{th}$ data line Dj+1.

Figure 7:
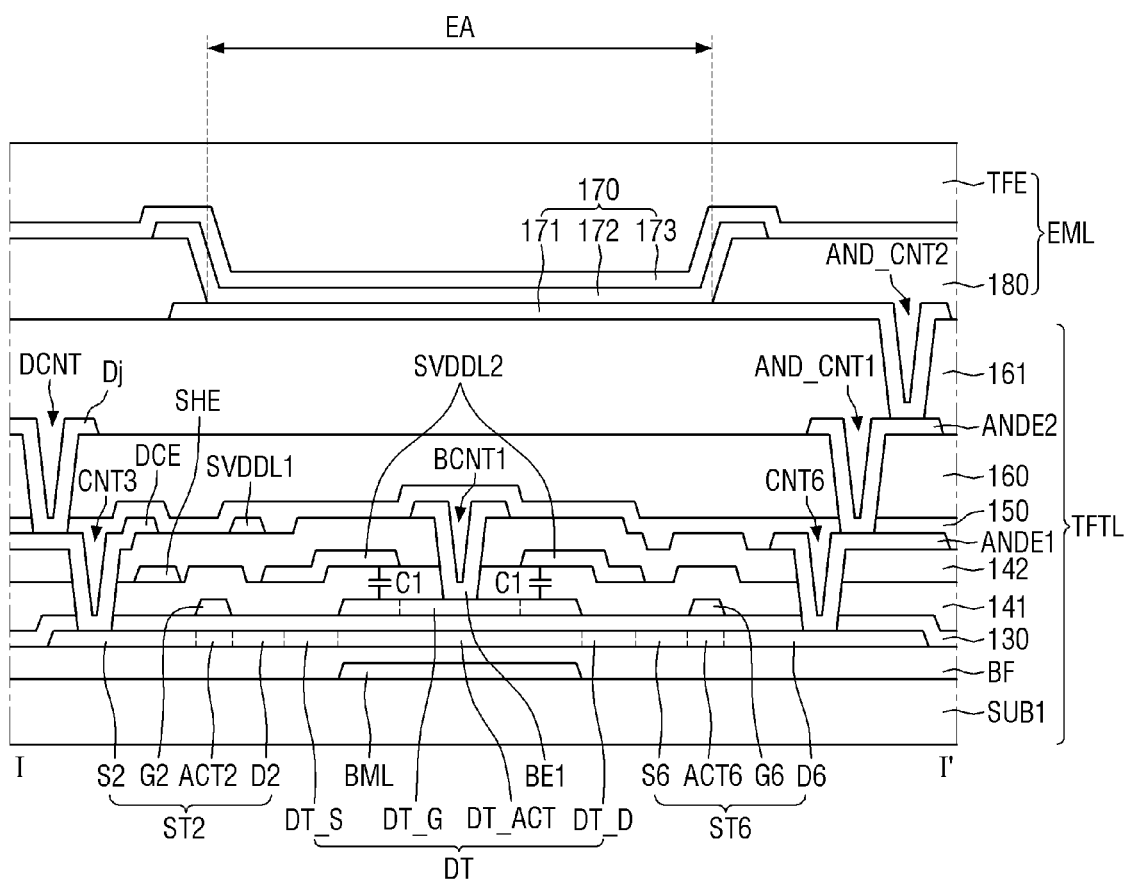
FIG. 7 is a cross-sectional view taken along line I-I' of FIG. 5.
Figure 8:
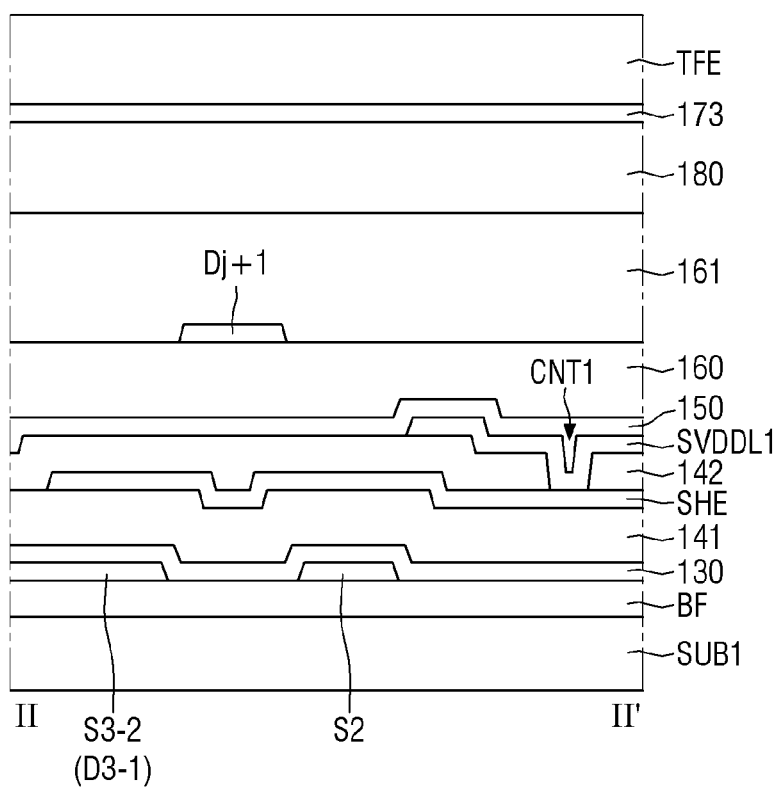
FIG. 8 is a cross-sectional view taken along line II-II' of FIG. 5.

FIG. 7 is a cross-sectional view taken along line I-I' of FIG. 5, and FIG. 8 is a cross-sectional view taken along line II-II' of FIG. 5.

Referring to FIGS. 7 and 8, a TFT layer TFTL, a light emitting element layer EML, and an encapsulation layer TFE may be sequentially disposed on a substrate SUB1.

The TFT layer TFTL includes a light blocking layer BML, a buffer film BF, an active layer, a first gate layer GTL1, a second gate layer GTL2, a data metal layer including a first data metal layer DTL1 and a second data metal layer DTL2, a gate insulating film 130, a first interlayer insulating film 141, a second interlayer insulating film 142, a protective film 150, a first organic film 160, and a second organic film 161.

The light blocking layer BML may be disposed on one surface of the substrate SUB1. The light blocking layer BML may overlap the active layer DT_ACT of the driving transistor DT in the third direction (Z-axis direction) to block light incident on the active layer DT_ACT of the driving transistor DT, but the invention is not limited thereto. In an alternative exemplary embodiment, the light blocking layer BML may overlap the active layer DT_ACT of the driving transistor DT and the active layers ACT1 to ACT6 of the first to sixth transistors ST1 to ST6 in the third direction (Z-axis direction) in order to block light incident on not only the active layer DT_ACT of the driving transistor DT but also the active layers ACT1 to ACT6 of the first to sixth transistors ST1 to ST6. The third direction (Z-axis direction) may be a thickness direction of the substrate SUB1. In an exemplary embodiment, the light blocking layer BML may have a single layer structure or a multi-layer structure including molybdenum (Mo), aluminum (Al), chromium (Cr), gold (Au), titanium (Ti), nickel (Ni), neodymium (Nd), copper (Cu), or an alloy thereof, for example.

The buffer film BF may be disposed on the light blocking layer BML. The buffer film BF may be disposed on one surface of the substrate SUB1 to protect TFTs and an organic light emitting layer 172 of the light emitting element layer EML from moisture permeating through the substrate SUB1 vulnerable to moisture permeation. The buffer film BF may include a plurality of alternately laminated inorganic films.

In an exemplary embodiment, the buffer film BF may be a multi-layer film in which two or more of a silicon nitride layer, a silicon oxynitride layer, a silicon oxide layer, a titanium oxide layer, and an aluminum oxide layer are alternately laminated, for example. In another exemplary embodiment, the buffer film BF may be omitted.

The active layer may be disposed on the substrate SUB1 or the buffer film BF. In an exemplary embodiment, the active layer may include polycrystalline silicon, monocrystalline silicon, low-temperature polycrystalline silicon, amorphous silicon, or an oxide semiconductor. When the active layer includes polycrystalline silicon or an oxide semiconductor, the active layer doped with ions may have conductivity. Thus, the active layer may include not only active layers DT_ACT, ACT1-1, ACT1-2, ACT2, ACT3-1, ACT3-2, ACT4, ACT5 and ACT6 of the driving transistor DT and the first to sixth transistors ST1 to ST6 but also first electrodes DT_S, S1-1, S1-2, S2, S3-1, S3-2, S4, S5, and S6 and second electrodes DT_D, D1-1, D1-2, D2, D3-1, D3-2, D4, D5, and D6.

The gate insulating film 130 may be disposed on the active layer. In an exemplary embodiment, the gate insulating film 130 may include an inorganic layer such as a silicon nitride layer, a silicon oxynitride layer, a silicon oxide layer, a titanium oxide layer, or an aluminum oxide layer.

The first gate layer GTL1 may be disposed on the gate insulating film 130. The first gate layer GTL1 may include not only a gate electrode of the driving transistor DT and gate electrodes G1-1, G1-2, G2, G3-1, G3-2, G4, G5 and G6 of the first to sixth transistors ST1 to ST6 but also scan lines Sk−1 and Sk and a light emission control line Ek. In an exemplary embodiment, the first gate layer GTL1 may have a single layer structure or a multi-layer structure including molybdenum (Mo), aluminum (Al), chromium (Cr), gold (Au), titanium (Ti), nickel (Ni), neodymium (Nd), copper (Cu), or an alloy thereof, for example.

The first interlayer insulating film 141 may be disposed on the first gate layer GTL1. In an exemplary embodiment, the first interlayer insulating film 141 may include an inorganic layer such as a silicon nitride layer, a silicon oxynitride layer, a silicon oxide layer, a titanium oxide layer, or an aluminum oxide layer. The first interlayer insulating film 141 may include a plurality of inorganic films.

The second gate layer GTL2 may be disposed on the first interlayer insulating film 141. The second gate layer GTL2 may include an initialization voltage line VIL, a second sub-driving voltage line SVDDL2, and a shielding electrode SHE. In an exemplary embodiment, the second gate layer GTL2 may have a single layer structure or a multi-layer structure including molybdenum (Mo), aluminum (Al), chromium (Cr), gold (Au), titanium (Ti), nickel (Ni), neodymium (Nd), copper (Cu), or an alloy thereof, for example.

The second interlayer insulating film 142 may be disposed on the second gate layer GTL2. In an exemplary embodiment, the second interlayer insulating film 142 may include an inorganic layer such as a silicon nitride layer, a silicon oxynitride layer, a silicon oxide layer, a titanium oxide layer, or an aluminum oxide layer. The second interlayer insulating film 142 may include a plurality of inorganic films.

The first data metal layer DTL1 may be disposed on the second interlayer insulating film 142. The first data metal layer DTL1 may include a first sub-driving voltage line SVDDL1, a first connection electrode BEL, a second connection electrode VIE, a data connection electrode DCE, and a first anode connection electrode ANDE1. In an exemplary embodiment, the first data metal layer DTL1 may have a single layer structure or a multi-layer structure including molybdenum (Mo), aluminum (Al), chromium (Cr), gold (Au), titanium (Ti), nickel (Ni), neodymium (Nd), copper (Cu), or an alloy thereof, for example.

The first organic film 160 for planarizing a step due to the active layer, the first gate layer GTL1, the second gate layer GTL2, and the first data metal layer DTL1 may be disposed on the first data metal layer DTL1. In an exemplary embodiment, the first organic film 160 may be an organic film including an acrylic resin, an epoxy resin, a phenolic resin, a polyamide resin, or a polyimide resin, for example.

The protective film 150 may be additionally disposed between the first data metal layer DTL1 and the first organic film 160. The protective film 150 may include an inorganic layer such as a silicon nitride layer, a silicon oxynitride layer, a silicon oxide layer, a titanium oxide layer, or an aluminum oxide layer.

The second data metal layer DTL2 may be disposed on the first organic film 160. The second data metal layer DTL2 may include data lines Dj and Dj+1 and a second anode connection electrode ANDE2. In an exemplary embodiment, the second data metal layer DTL2 may have a single layer structure or a multi-layer structure including molybdenum (Mo), aluminum (Al), chromium (Cr), gold (Au), titanium (Ti), nickel (Ni), neodymium (Nd), copper (Cu), or an alloy thereof, for example.

The second organic film 161 for planarizing a step may be disposed on the second data metal layer DTL2. The second organic film 161 may be an organic film including an acrylic resin, an epoxy resin, a phenolic resin, a polyamide resin, or a polyimide resin.

Although it is exemplified that the driving transistor DT and the first to sixth transistors ST1 to ST6 are provided by a top gate method in which a gate electrode is disposed over an active layer, the invention is not limited thereto. That is, the driving transistor DT and the first to sixth transistors ST1 to ST6 may be provided by a bottom gate method in which a gate electrode is disposed under an active layer or a double gate method in which gate electrodes are disposed over and under an active layer.

The first connection contact hole BCNT1 may be a hole that penetrates the first interlayer insulating film 141 and the second interlayer insulating film 142 to expose the gate electrode DT_G of the driving transistor DT. The first connection electrode BE1 may be connected to the gate electrode DT_G of the driving transistor DT through the first connection contact hole BCNT1.

The second connection contact hole BCNT2 may be a hole that penetrates the gate insulating film 130, the first interlayer insulating film 141 and the second interlayer insulating film 142 to expose the second electrode D1_1 of the (1-1)th transistor ST1-1. The first connection electrode BE1 may be connected to the second electrode D1-1 of the (1-1)th transistor ST1-1 through the second connection contact hole BCNT2.

The data contact hole DCNT may be a hole that penetrates the first organic film 160 to expose the data connection electrode DCE. Each of the data lines Dj and Dj+1 may be connected to the data connection electrode DCE through the data contact hole DCNT.

The first contact hole CNT1 may be a hole that penetrates the second interlayer insulating film 142 to expose the shielding electrode SHE. The first sub-driving voltage line SVDDL1 may be connected to the shielding electrode SHE through the first contact hole CNT1.

The third contact hole CNT3 may be a hole that penetrates the gate insulating film 130, the first interlayer insulating film 141 and the second interlayer insulating film 142 to expose the second electrode D2 of the second transistor ST2. The data connection electrode DCE may be connected to the second electrode D2 of the second transistor ST2 through the third contact hole CNT3.

The fourth contact hole CNT4 may be a hole that penetrates the gate insulating film 130, the first interlayer insulating film 141 and the second interlayer insulating film 142 to expose the second electrode D3-2 of the (3-2)th transistor ST3-2 and the second electrode D4 of the fourth transistor ST4. The second connection electrode VIE may be connected to the second electrode D3-2 of the (3-2)th transistor ST3-2 and the second electrode D4 of the fourth transistor ST4 through the fourth contact hole CNT4.

The fifth contact hole CNT5 may be a hole that penetrates the second interlayer insulating film 142 to expose the initialization voltage line VIL. The second connection electrode VIE may be connected to the initialization voltage line VIL through the fifth contact hole CNT5.

The sixth contact hole CNT6 may be a hole that penetrates the gate insulating film 130, the first interlayer insulating film 141 and the second interlayer insulating film 142 to expose the second electrode D6 of the sixth transistor ST6. The first anode connection electrode ANDE1 may be connected to the second electrode D6 of the sixth transistor ST6 through the sixth contact hole CNT6.

The seventh contact hole CNT7 may be a hole that penetrates the gate insulating film 130, the first interlayer insulating film 141 and the second interlayer insulating film 142 to expose the first electrode S5 of the fifth transistor ST5. The first sub-driving voltage line SVDDL1 may be connected to the first electrode S5 of the fifth transistor ST5 through the seventh contact hole CNT7.

The eighth contact hole CNT8 may be a hole that penetrates the second interlayer insulating film 142 to expose the second sub-driving voltage line SVDDL2. The first sub-driving voltage line SVDDL1 may be connected to the second sub-driving voltage line SVDDL2 through the eighth contact hole CNT8.

The first anode contact hole AND_CNT1 may be a hole that penetrates the protective film 150 and the first organic film 160 to expose the first anode connection electrode ANDE1. The second anode connection electrode ANDE2 may be connected to the first anode connection electrode ANDE1 through the first anode contact hole AND_CNT1.

The second anode contact hole AND_CNT2 may be a hole that penetrates the second organic film 161 to expose the second anode connection electrode ANDE2.

The light emitting element layer EML may be disposed on the TFT layer TFTL. The light emitting element layer EML may include light emitting elements 170 and a pixel defining film 180.

The light emitting elements 170 and the pixel defining film 180 are disposed on the second organic film 161. Each of the light emitting elements 170 may include a first electrode 171, an organic light emitting layer 172, and a second electrode 173.

The first electrode 171 may be disposed on the second organic film 161. The first electrode 171 may be connected to the second anode connection electrode ANDE2 through the second anode contact hole AND_CNT2.

In a top emission structure in which light is emitted from the organic light emitting layer 172 toward the second electrode 173, the first electrode 171 may include a metal material having high reflectance such as a laminated structure (Ti/Al/Ti) of aluminum and titanium, a laminated structure ("ITO/Al/ITO") of aluminum and indium tin oxide ("ITO"), an APC alloy, or a laminated structure ("ITO/APC/

ITO") of an APC alloy and ITO. The APC alloy refers to an alloy of silver (Ag), palladium (Pd), and copper (Cu).

The pixel defining film 180 may divide the first electrode 171 on the second organic film 161 to define a light emitting area EA of each of the sub-pixels SP. The pixel defining film 180 may cover the edge of the first electrode 171, and may include an organic film including an acrylic resin, an epoxy resin, a phenolic resin, a polyamide resin, or a polyimide resin, for example.

The light emitting area EA of each of the sub-pixels SP is defined as an area in which the first electrode 171, the organic light emitting layer 172, and the second electrode 173 are sequentially laminated, and thus holes from the first electrodes 171 are combined with electrons from the second electrode 173 to emit light.

The organic light emitting layer 172 may be disposed on the first electrode 171 and the pixel defining film 180. The organic light emitting layer 172 may include an organic material to emit light of a predetermined color. In an exemplary embodiment, the organic light emitting layer 172 may include a hole transporting layer, an organic material layer, and an electron transporting layer, for example. Among the sub-pixels SP, the organic light emitting layer 172 of the first sub-pixel may emit light of a first color, the organic light emitting layer 172 of the second sub-pixel may emit light of a second color, and the organic light emitting layer 172 of the third sub-pixel may emit light of a third color. In an alternative exemplary embodiment, the organic light emitting layers 172 of the sub-pixels SP may emit white light. In this case, the first sub-pixel may overlap a color filter layer of the first color, the second sub-pixel may overlap a color filter layer of the second color, and the third sub-pixel may overlap a color filter layer of the third color. In an exemplary embodiment, the first color may be red, the second color may be green, and the third color may be blue, for example, but the invention is not limited thereto.

The second electrode 173 is disposed on the organic light emitting layer 172. The second electrode 173 may cover the organic light emitting layer 172, and may be a common layer provided commonly in the sub-pixels SP. A capping layer may be disposed on the second electrode 173.

In the top emission structure, the second electrode 173 may include a transparent conductive material ("TCO") such as ITO or indium zinc oxide ("IZO"), which may transmit light, or a semi-transmissive conductive material such as magnesium (Mg), silver (Ag) or an alloy of magnesium (Mg) and silver (Ag). When the second electrode 173 includes a semi-transmissive conductive material, light emission efficiency may be increased by microcavities.

The encapsulation layer TFE may be disposed on the light emitting element layer EML. The encapsulation layer TFE may include at least one inorganic film to prevent the penetration of oxygen or moisture into the light emitting element layer EML. Further, the encapsulation layer TFE may include at least one organic film to protect the light emitting element layer EML from foreign matter such as dust.

In an alternative exemplary embodiment, a substrate may be disposed on the light emitting element layer EML instead of the encapsulation layer TFE, and a space between the light emitting element layer EML and the substrate may be empty in a vacuum state or may be provided with a filling film. The filling film may be an epoxy filled film or a silicon filled film.

Referring to FIGS. 5, 7 and 8, the shielding electrode SHE may overlap at least a part of the first transistor ST1 in the third direction (Z-axis direction). In an exemplary embodiment, the shielding electrode SHE may overlap the first electrode S1-1 of the (1-1)th transistor ST1-1 and the second electrode D1-2 of the (1-2)th transistor ST1-2 in the third direction (Z-axis direction), for example. The shielding electrode SHE may serve as a barrier between the first electrode S1-1 of the (1-1)th transistor ST1-1 and the $j+1_{th}$ data line Dj+1 and between the second electrode D1-2 of the (1-2)th transistor ST1-2 and the $j+1_{th}$ data line Dj+1. Therefore, the influence of data voltage transition of the $j+1_{th}$ data line Dj+1 on the first electrode S1-1 of the (1-1)th transistor ST1-1 and the second electrode D1-2 of the (1-2)th transistor ST1-2 may be reduced.

As shown in FIG. 6, the shielding portion SHP of the shielding electrode SHE may cross the $j+1_{th}$ data line Dj+1. Thus, a parasitic capacitance may be provided between the shielding portion SHP of the shielding electrode SHE and the $j+1_{th}$ data line Dj+1. Due to the parasitic capacitance, the first driving voltage of the first driving voltage line VDDL1 may be influenced by the data voltage transition of the $j+1_{th}$ data line Dj+1.

Figure 9:
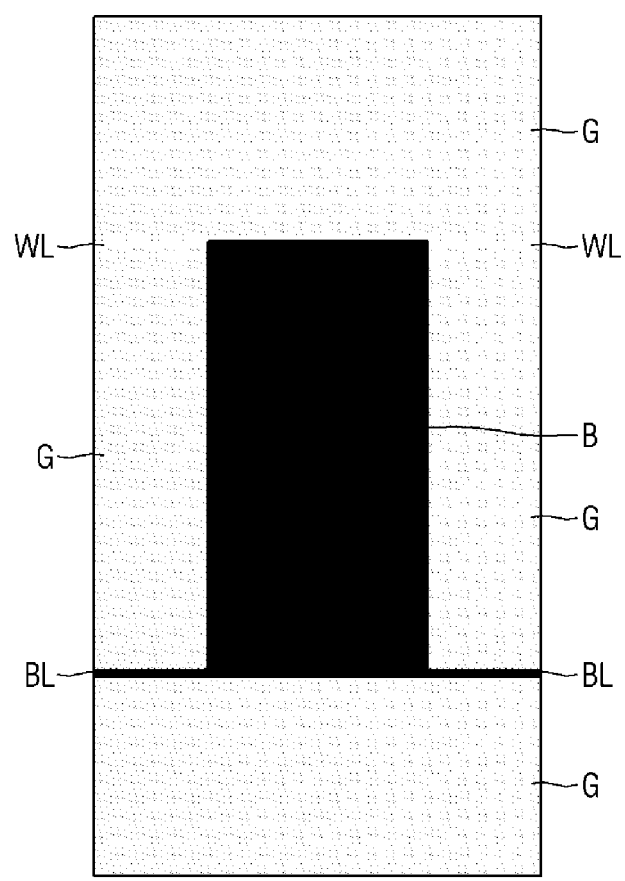
FIG. 9 is an exemplary view showing a horizontal crosstalk occurring when a shielding electrode overlaps a data line.

In an exemplary embodiment, as shown in FIG. 9, when the center area of the display panel 100 displays a black image B and the remaining area thereof displays a gray image G, the data voltage applied to the sub-pixels SP displaying the black image B may be higher than the data voltage applied to the sub-pixels SP displaying the gray image G, for example.

The first driving voltage of the first driving voltage line VDDL1 may increase at the boundary between the black image B and the gray image G at the upper end of the black image B. Thus, the sub-pixels SP desired to display the gray image G display a white image, and therefore horizontal crosstalk in which a white line WL is visible to a user may occur. Further, the first driving voltage of the first driving voltage line VDDL1 may decrease at the boundary between the black image B and the gray image G at the lower end of the black image B. Thus, the sub-pixels SP desired to display the gray image G display a black image, and therefore horizontal crosstalk in which a black line BL is visible to a user may occur.

Hereinafter, a display device 10 capable of reducing the influence of data voltage transition of a data line on the (1-1)th transistor ST1-1 adjacent to the data line and preventing the occurrence of horizontal crosstalk will be described in detail.

Figure 10:
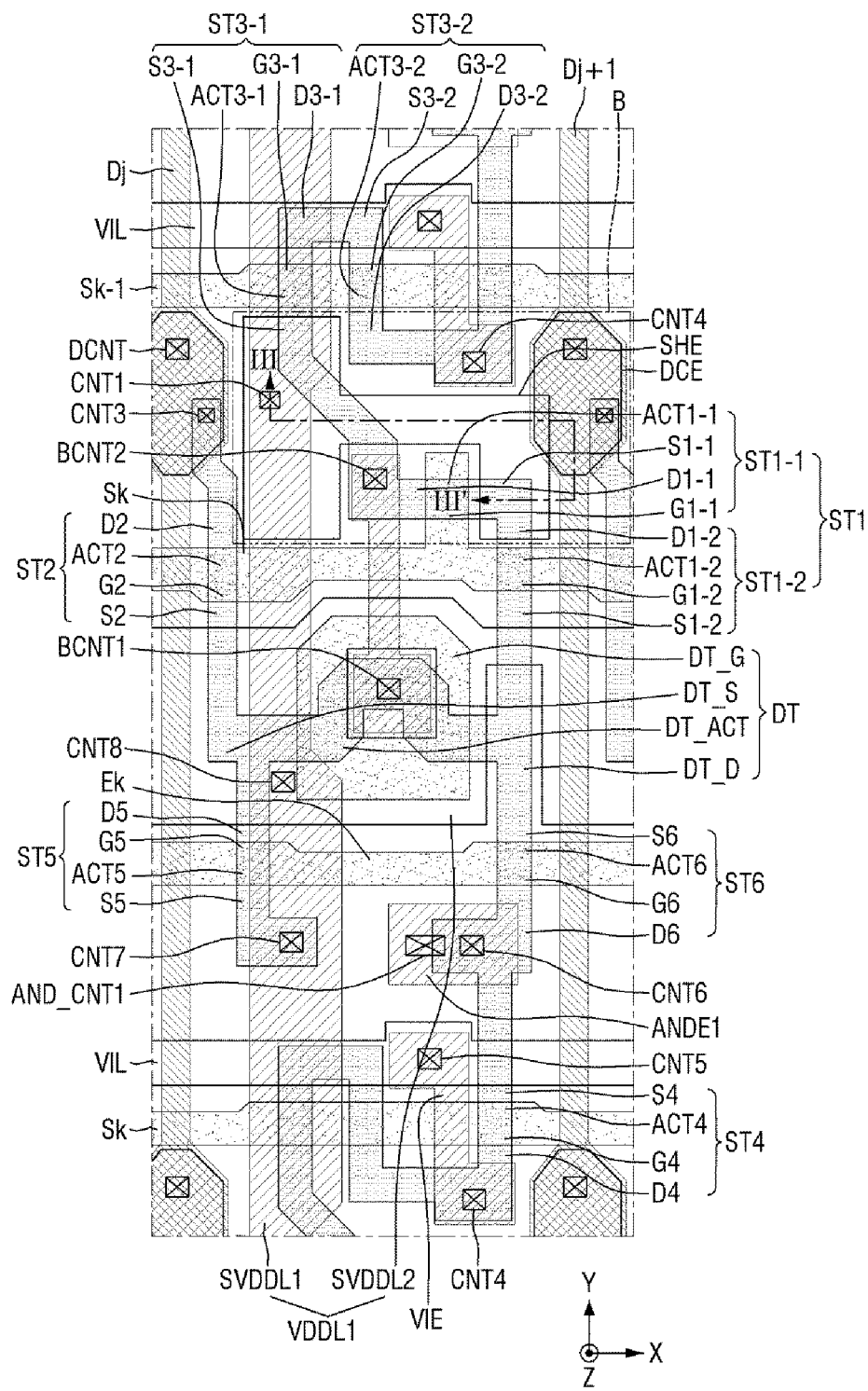
FIG. 10 is a detailed plan view of another exemplary embodiment of a sub-pixel.
Figure 11:
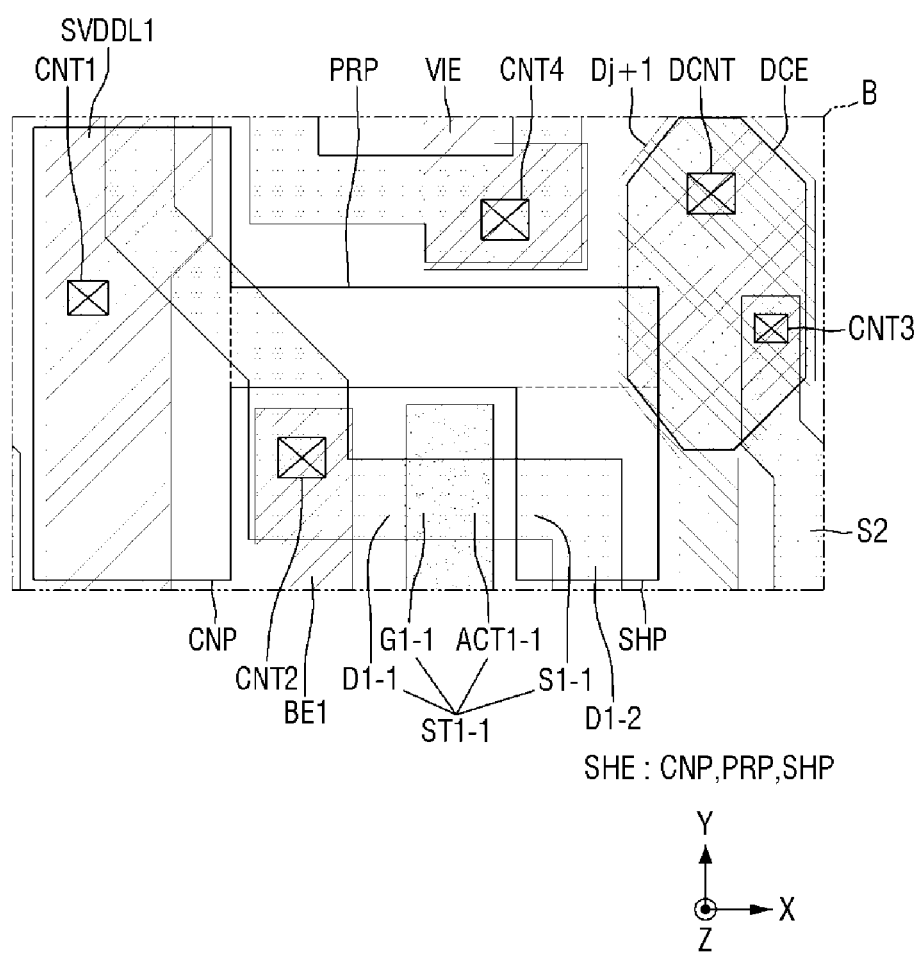
FIG. 11 is a detailed plan view of the area B of FIG. 10.
Figure 12:
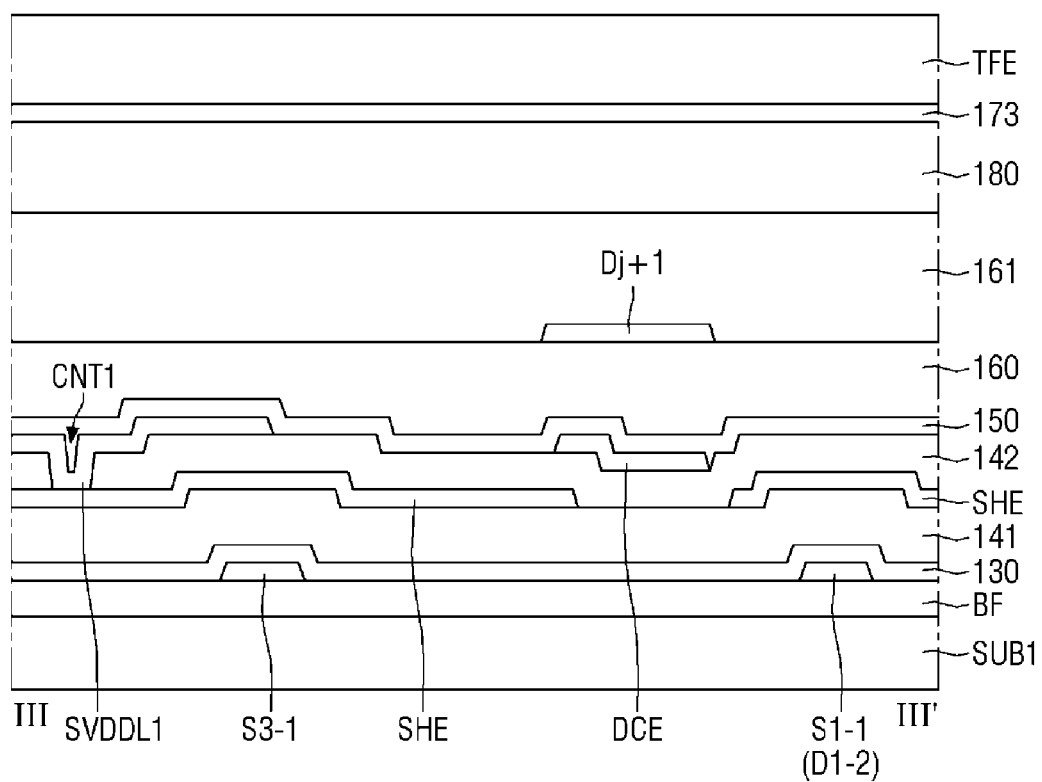
FIG. 12 is a cross-sectional view taken along line III-III' of FIG. 10.

FIG. 10 is a detailed plan view of another exemplary embodiment of a sub-pixel, FIG. 11 is a detailed plan view of the area B of FIG. 10, and FIG. 12 is a cross-sectional view taken along line III-III' of FIG. 10.

The exemplary embodiment of FIGS. 10 to 12 is different from the exemplary embodiment of FIGS. 5 to 8 in that the shielding electrode SHE does not overlap the $j_{th}$ data line Dj in the third direction (Z-axis direction), and is connected to the first sub-driving voltage line SVDDL1 adjacent to the $j_{th}$ data line Dj in the first direction (X-axis direction).

Referring to FIGS. 10 to 12, the shielding electrode SHE may include a connection portion CNP, a protrusion portion PRP, and a shielding portion SHP.

The connection portion CNP may be connected to the first sub-driving voltage line SVDDL1 adjacent to the $j_{th}$ data line Dj in the first direction (X-axis direction). The connection portion CNP may be connected to the first sub-driving voltage line SVDDL1 through the first contact hole CNT1.

The connection portion CNP may overlap the first sub-driving voltage line SVDDL1 in the third direction (Z-axis direction). In the overlapping region of the first sub-driving voltage line SVDDL1 and the connection portion CNP, the length of the connection portion CNP in the first direction (X-axis direction) may be longer than the length of the first sub-driving voltage line SVDDL1 in the first direction (X-axis direction).

The connection portion CNP may extend in the second direction (Y-axis direction). One end of the connection portion CNP in the second direction (Y-axis direction) may be adjacent to the $k-1_{th}$ scan line Sk−1, and the other end of the connection portion CNP in the second direction (Y-axis direction) may be adjacent to the $k_{th}$ scan line Sk. The connection portion CNP may be disposed between the $k-1_{th}$ scan line Sk−1 and the $k_{th}$ scan line Sk in the second direction (Y-axis direction). The connection portion CNP may not overlap the $k-1_{th}$ scan line Sk−1 and the $k_{th}$ scan line Sk in the third direction (Z-axis direction).

The protrusion portion PRP may protrude from the connection portion CNP and extend in the first direction (X-axis direction). One end of the protrusion portion PRP may overlap the $j+1_{th}$ data line Dj+1 in the third direction (Z-axis direction). One end of the protrusion portion PRP may overlap the data connection electrode DCE in the third direction (Z-axis direction). The protrusion portion PRP may be disposed between the second connection electrode VIE and the gate electrode G1-1 of the (1-1)th transistor ST1-1 in the second direction (Y-axis direction). The protrusion portion PRP may not overlap the second connection electrode VIE and the gate electrode GT-1 of the (1-1)th transistor ST1-1 in the third direction (Z-axis direction).

The shielding portion SHP may overlap at least a part of the first transistor ST1 in the third direction (Z-axis direction). The shielding portion SHP may overlap the first electrode S1-1 of the (1-1)th transistor ST1-1 and the second electrode D1-2 of the (1-2)th transistor ST1-2 in the third direction (Z-axis direction).

The shielding portion SHP may protrude from the protrusion portion PRP and extend in the second direction (Y-axis direction). The shielding portion SHP may protrude from one end of the protrusion portion PRP. One end of the shielding portion SHP may be adjacent to the $k_{th}$ scan line Sk in the second direction (Y-axis direction). The shielding portion SHP may not overlap the $k_{th}$ scan line Sk in the third direction (Z-axis direction).

The first electrode S1-1 of the (1-1)th transistor ST1-1 and the second electrode D1-2 of the (1-2)th transistor ST1-2 may be disposed on the buffer film BF, and the shielding electrode SHE may be disposed on the first interlayer insulating film 141. The first sub-driving voltage line SVDDL1 and the data connection electrode DCE may be disposed on the second interlayer insulating film 142, and the $j+1_{th}$ data line Dj+1 may be disposed on the first organic film 160.

The first connection electrode BET may be adjacent to the connection portion CNP in the first direction (X-axis direction), and may be adjacent to the protrusion portion PRP in the second direction (Y-axis direction).

According to the exemplary embodiment of FIGS. 10 to 12, the shielding electrode SHE may overlap at least a part of the first transistor ST1 in the third direction (Z-axis direction). In an exemplary embodiment, the shielding electrode SHE may overlap the first electrode S1-1 of the (1-1)th transistor ST1-1 and the second electrode D1-2 of the (1-2)th transistor ST1-2 in the third direction (Z-axis direction), for example. The shielding electrode SHE may be disposed between the first electrode S1-1 of the (1-1)th transistor ST1-1 and the $j+1_{th}$ data line Dj+1 and between the second electrode D1-2 of the (1-2)th transistor ST1-2 and the $j+1_{th}$ data line Dj+1 to serve as a barrier. Therefore, the influence of data voltage transition of the $j+1_{th}$ data line Dj+1 on the first electrode S1-1 of the (1-1)th transistor ST1-1 and the second electrode D1-2 of the (1-2)th transistor ST1-2 may be reduced.

The parasitic capacitance provided between the shielding electrode SHE and the $j+1_{th}$ data line Dj+1 in the exemplary embodiment of FIGS. 5 to 8 and the parasitic capacitance provided between the shielding electrode SHE and the $j+1_{th}$ data line Dj+1 in the exemplary embodiment of FIGS. 10 to 12 are given in Table 1 below. As given in Table 1, the parasitic capacitance provided between the shielding electrode SHE and the $j+1_{th}$ data line Dj+1 may be reduced by reducing the overlapping area of the shielding electrode SHE and the $j+1_{th}$ data line Dj+1. Therefore, the influence of data voltage transition of the data lines Dj and Dj+1 on the first driving voltage line VDDL may be reduced.

TABLE 1

|  | Embodiment of FIGS. 5 to 8 | Embodiment of FIGS. 10 to 12 |
| --- | --- | --- |
| Capacitance | $3.13 \times 10^{-14}$ F | $1.23 \times 10^{-14}$ F |

Figure 13:
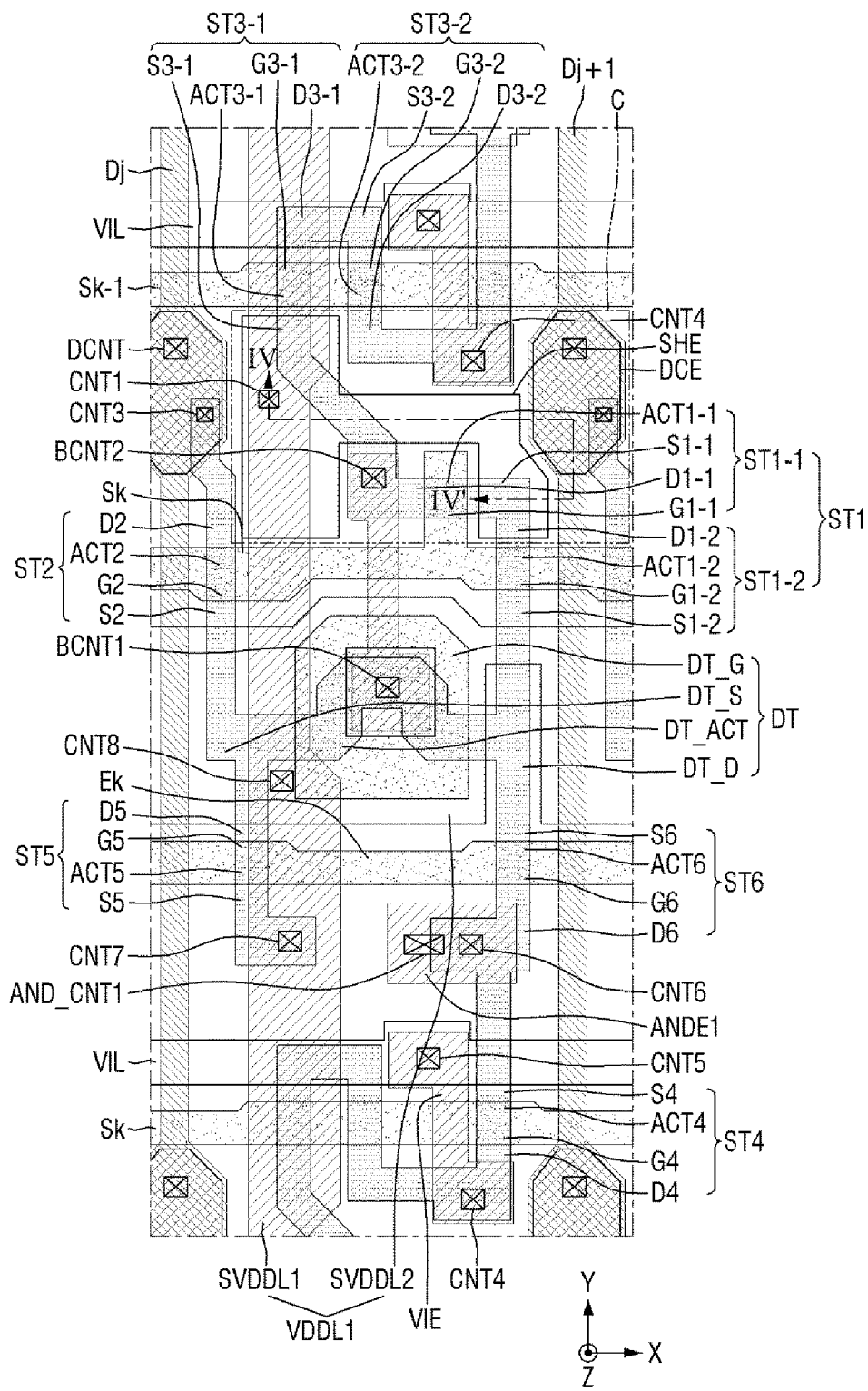
FIG. 13 is a detailed plan view of another exemplary embodiment of a sub-pixel.
Figure 14:
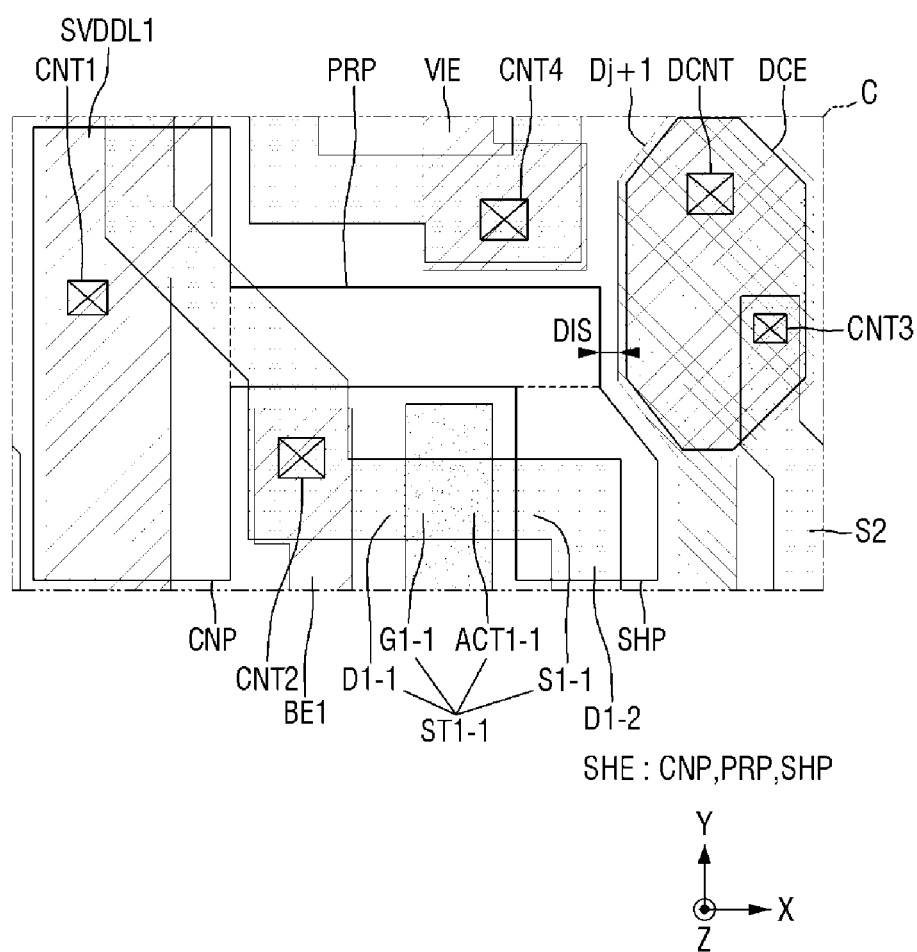
FIG. 14 is a detailed plan view of the area C of FIG. 13.
Figure 15:
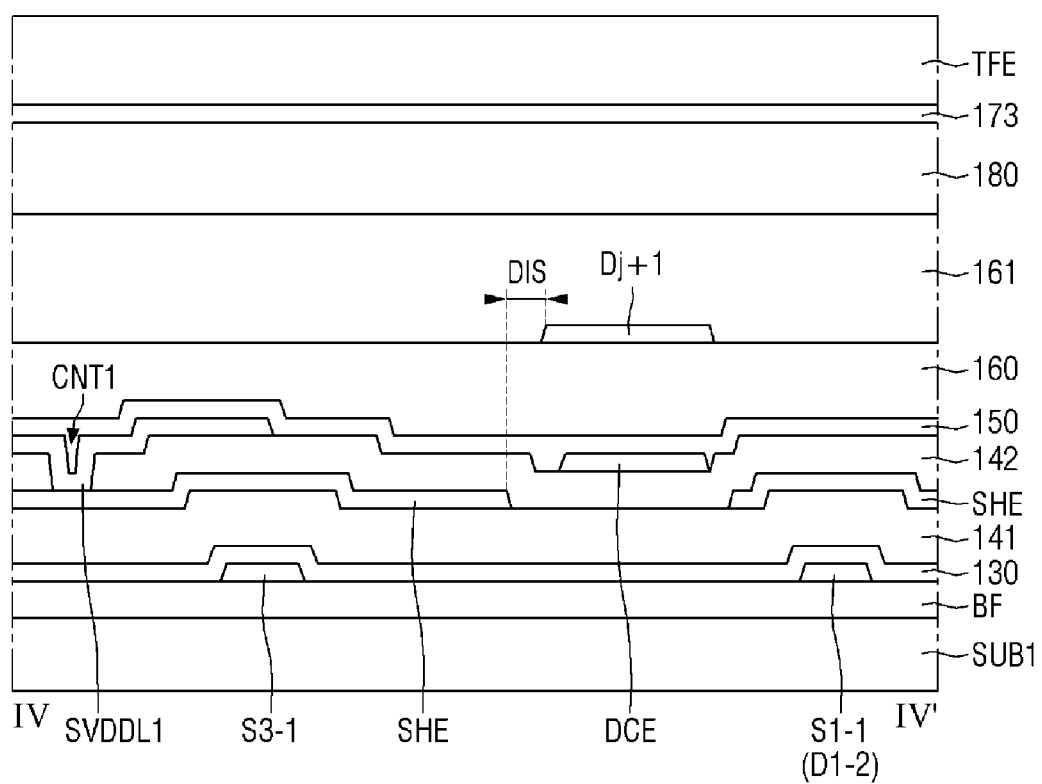
FIG. 15 is a cross-sectional view taken along line IV-IV' of FIG. 13.

FIG. 13 is a detailed plan view of another exemplary embodiment of a sub-pixel, FIG. 14 is a detailed plan view of the area C of FIG. 13, and FIG. 15 is a cross-sectional view taken along line IV-IV' of FIG. 13.

The exemplary embodiment of FIGS. 13 to 15 is different from the exemplary embodiment of FIGS. 10 to 12 in that the shielding electrode SHE does not overlap the $j+1_{th}$ data line Dj+1 in the third direction (Z-axis direction).

Referring to FIGS. 13 to 15, the protrusion portion PRP of the shielding electrode SHE may protrude from the connection portion CNP and extend in the first direction (X-axis direction). One end of the protrusion portion PRP may be adjacent to the $j+1_{th}$ data line Dj+1 in the first direction (X-axis direction). One end of the protrusion portion PRP may be adjacent to the data connection electrode DCE in the first direction (X-axis direction). The protrusion portion PRP may not overlap the $j+1_{th}$ data line Dj+1 in the third direction (Z-axis direction). The protrusion portion PRP may not overlap the data connection electrode DCE in the third direction (Z-axis direction).

The protrusion portion PRP may be disposed between the second connection electrode VIE and the gate electrode G1-1 of the (1-1)th transistor ST1-1 in the second direction (Y-axis direction). The protrusion portion PRP may not overlap the second connection electrode VIE and the gate electrode G1-1 of the (1-1)th transistor ST1-1 in the third direction (Z-axis direction).

The first electrode S1-1 of the (1-1)th transistor ST1-1 and the second electrode D1-2 of the (1-2)th transistor ST1-2 may be disposed on the buffer film BF, and the shielding electrode SHE may be disposed on the first interlayer insulating film 141. The first sub-driving voltage line SVDDL1 and the data connection electrode DCE may be disposed on the second interlayer insulating film 142, and the $j+1_{th}$ data line Dj+1 may be disposed on the first organic film 160.

The parasitic capacitance provided between the shielding electrode SHE and the $j+1_{th}$ data line Dj+1 in the exemplary embodiment of FIGS. 10 to 12 and the parasitic capacitance provided between the shielding electrode SHE and the $j+1_{th}$ data line Dj+1 in the exemplary embodiment of FIGS. 13 to 15 are given in Table 2 below. As given in Table 2, the parasitic capacitance provided between the shielding electrode SHE and the j+1$_{th}$ data line Dj+1 may be reduced by reducing the overlapping area of the shielding electrode SHE and the j+1$_{th}$ data line Dj+1. Therefore, the influence of data voltage transition of the data lines Dj and Dj+1 on the first driving voltage line VDDL may be reduced.

TABLE 2

|  | Embodiment of FIGS. 10 to 12 | Embodiment of FIGS. 13 to 15 |
| --- | --- | --- |
| Capacitance | $1.23 \times 10^{-14}$ F | $0.88 \times 10^{-14}$ F |

As shown in FIGS. 14 and 15, in order to minimize the parasitic capacitance provided between the shielding electrode SHE and the j+1$_{th}$ data line Dj+1, the distance DIS between the protrusion portion PRP and the j+1$_{th}$ data line Dj+1 in the first direction (X-axis direction) may be equal to or greater than about 1 micrometer (μm).

Figure 16:
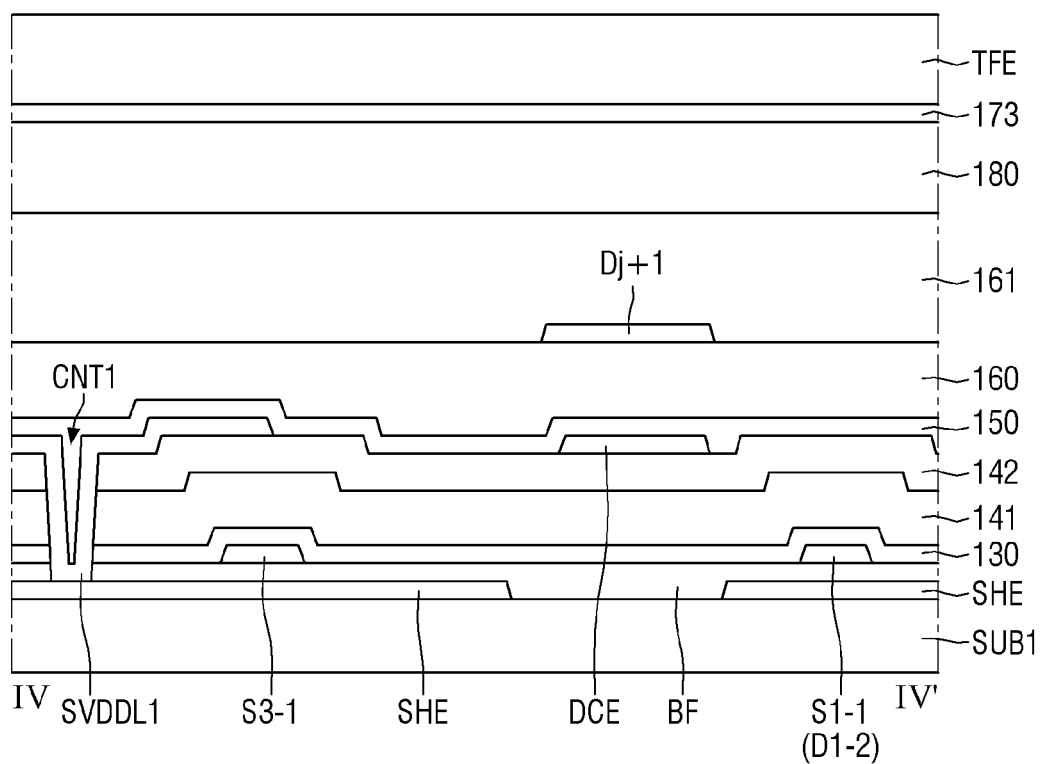
FIG. 16 is another cross-sectional view taken along line IV-IV' of FIG. 13.

FIG. 16 is another cross-sectional view taken along line IV-IV' of FIG. 13.

The exemplary embodiment of FIG. 16 is different from the exemplary embodiment of FIG. 15 in that the shielding electrode SHE is disposed on the substrate SUB1, and the buffer film BF is disposed on the shielding electrode SHE.

Referring to FIG. 16, the first sub-driving voltage line SVDDL1 may be connected to the shielding electrode SHE through the first contact hole CNT1 penetrating the buffer film BF, the gate insulating film 130, the first interlayer insulating film 141, and the second interlayer insulating film 142.

As shown in FIG. 16, due to the shielding electrode SHE, coupling caused by the parasitic capacitance provided between the first electrode S1-1 of the (1-1)th transistor ST1-1 and the j+1$_{th}$ data line Dj+1 and between the second electrode D1-2 of the (1-2)th transistor ST1-2 and the j+1$_{th}$ data line Dj+1 may be reduced. Therefore, the influence of data voltage transition of the j+1$_{th}$ data line Dj+1 on the first electrode S1-1 of (1-1)th transistor ST1-1 and the second electrode D1-2 of (1-2)th transistor ST1-2 may be reduced.

Figure 17:
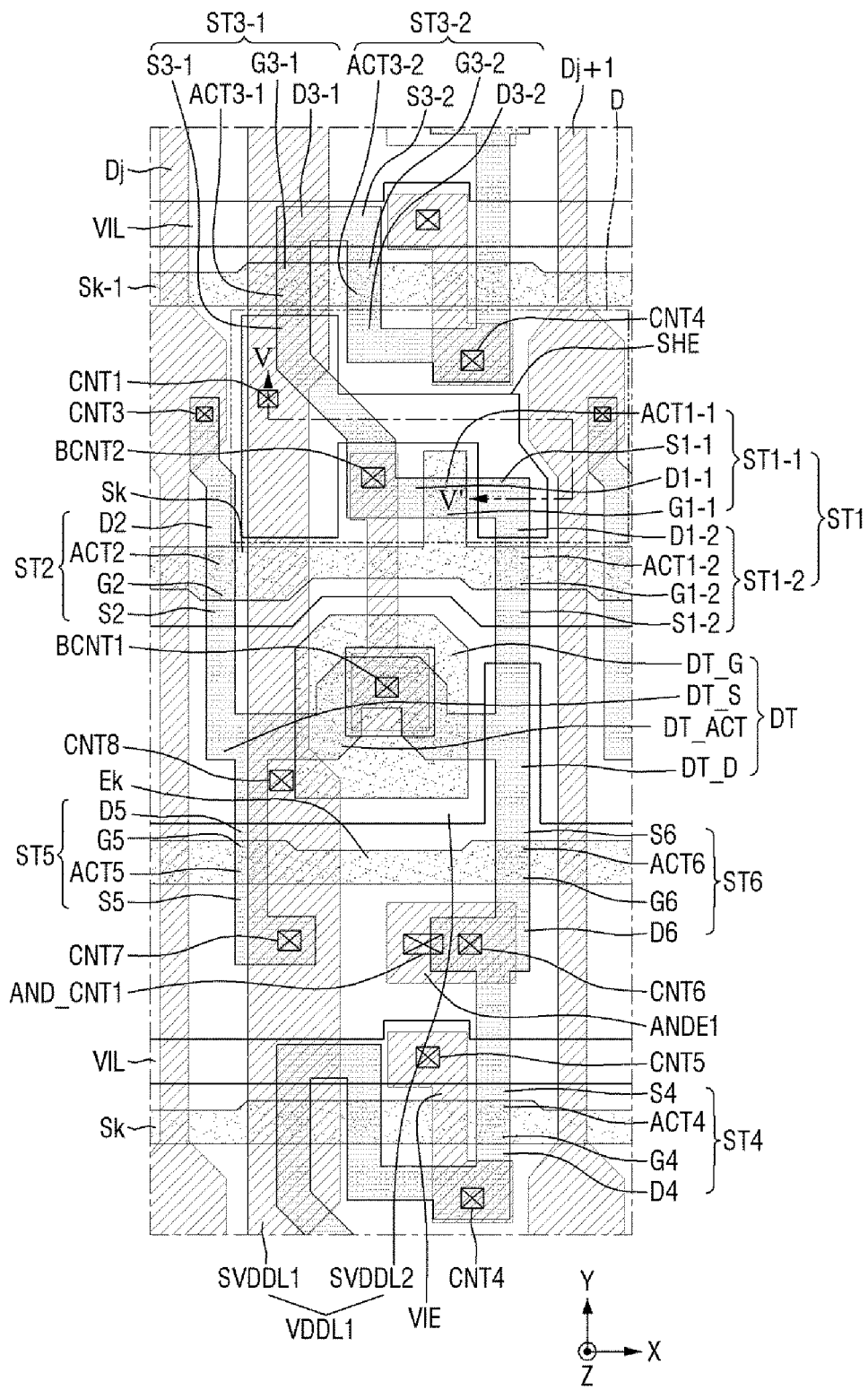
FIG. 17 is a detailed plan view of another exemplary embodiment of a sub-pixel.
Figure 18:
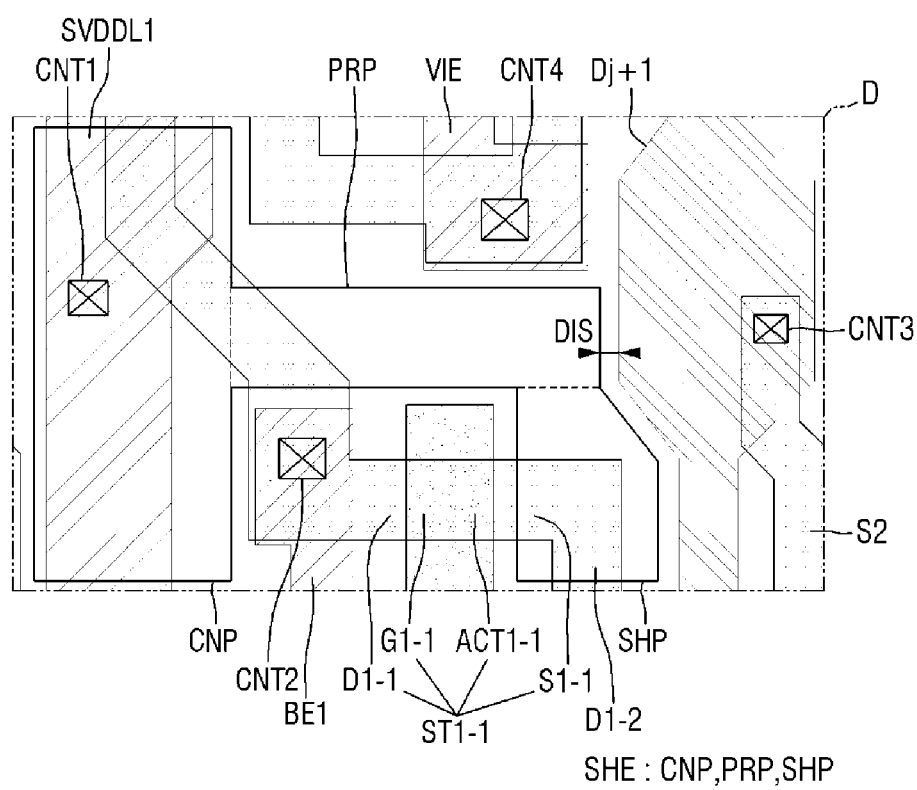
FIG. 18 is a detailed plan view of the area D of FIG. 17.
Figure 19:
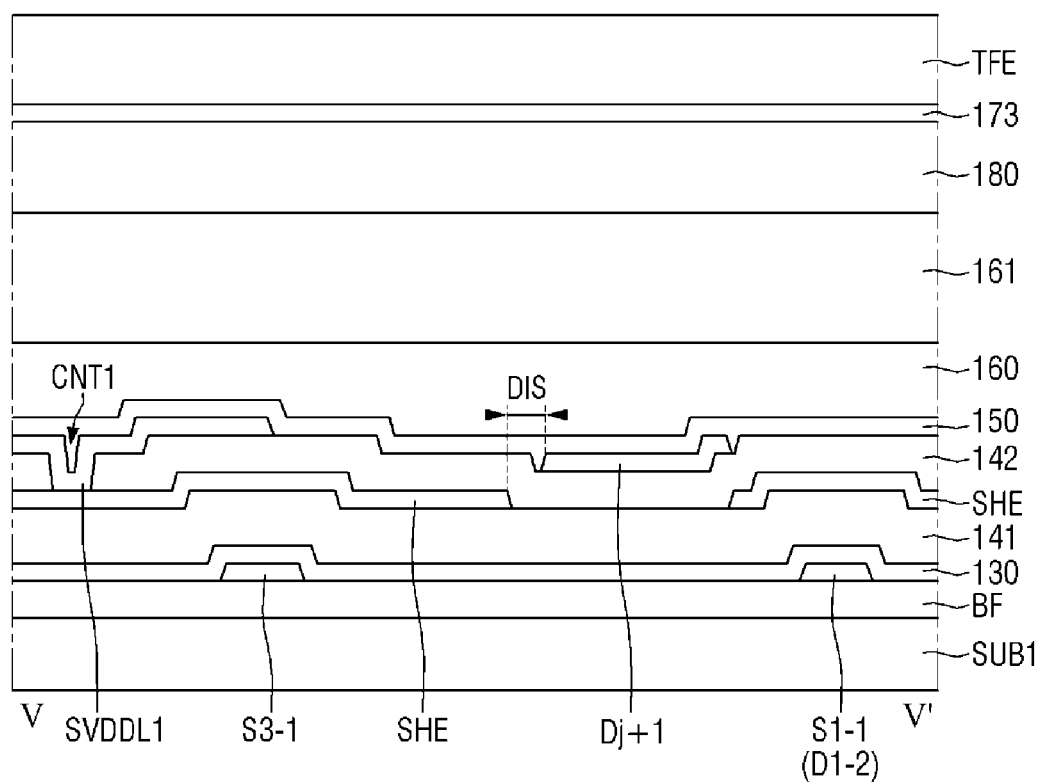
FIG. 19 is a cross-sectional view taken along line V-V' of FIG. 17.

FIG. 17 is a detailed plan view of another exemplary embodiment of a sub-pixel, FIG. 18 is a detailed plan view of the area D of FIG. 17, and FIG. 19 is a cross-sectional view taken along line V-V' of FIG. 17.

The exemplary embodiment of FIGS. 17 to 19 is different from the exemplary embodiment of FIGS. 13 to 15 only in that the data lines Dj, Dj+1, and Dj+2 are disposed in the first data metal layer DTL1, the data connection electrode DCE and the data contact hole DCNT are omitted, and each of the data lines Dj, Dj+1, and Dj+2 is connected to the second electrode D2 of the second transistor ST2. Therefore, a detailed description of the exemplary embodiment of FIGS. 17 to 19 will be omitted.

Figure 20:
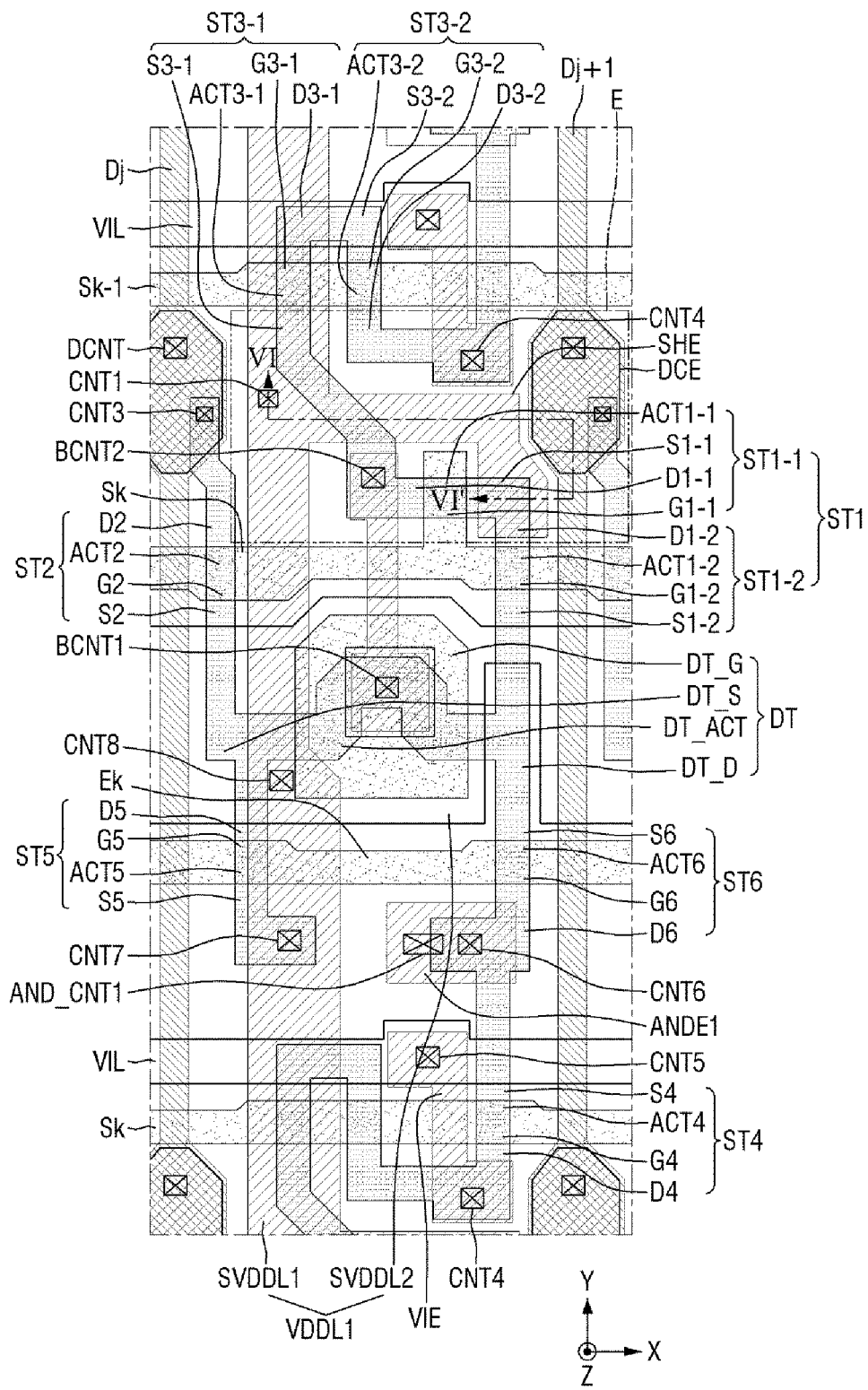
FIG. 20 is a detailed plan view of another exemplary embodiment of a sub-pixel.
Figure 21:
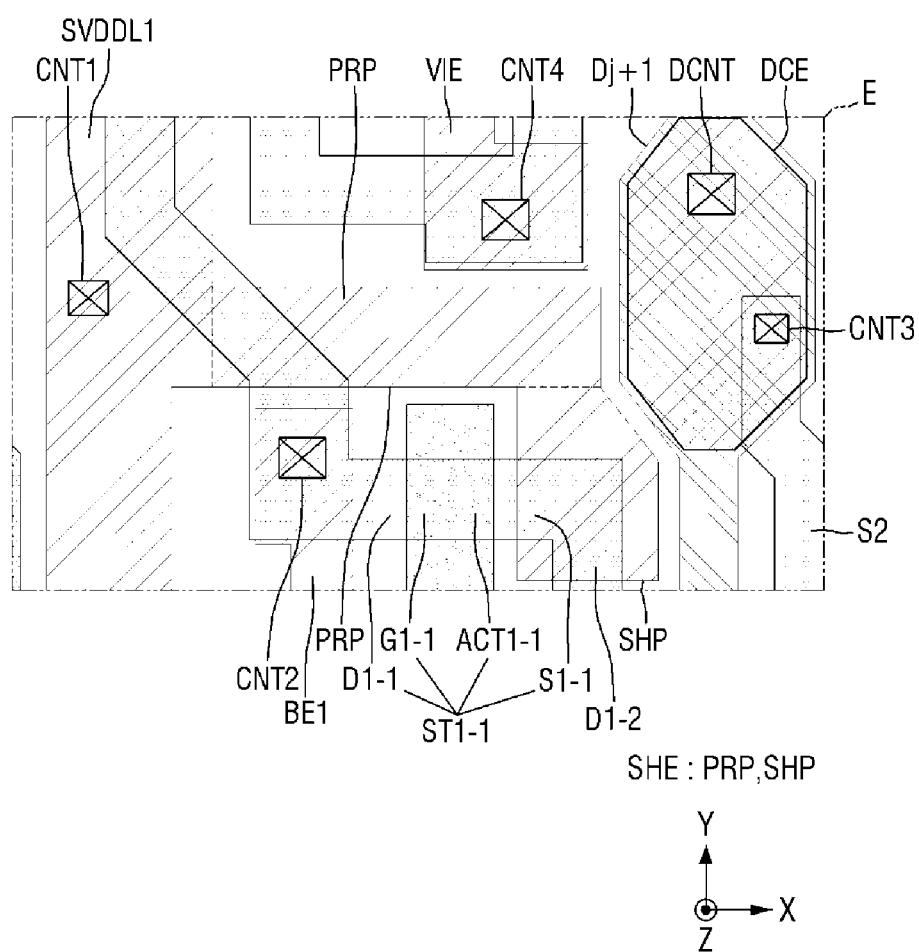
FIG. 21 is a detailed plan view of the area E of FIG. 20.
Figure 22:
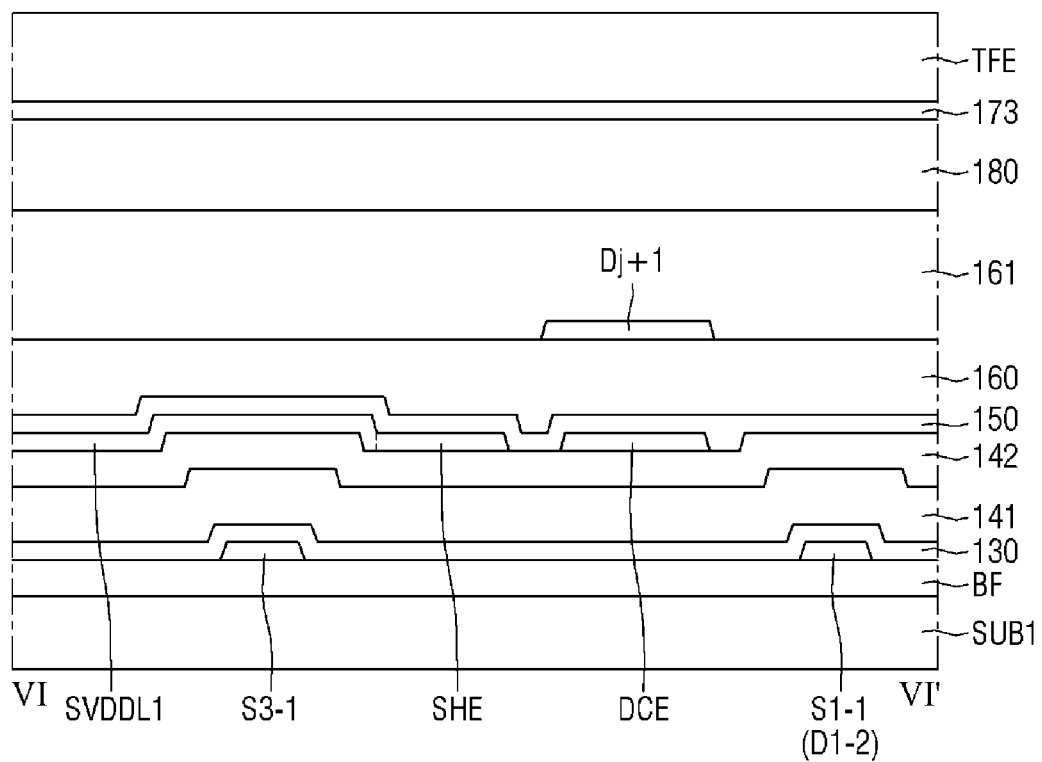
FIG. 22 is a cross-sectional view taken along line VI-VI' of FIG. 20.

FIG. 20 is a detailed plan view of another exemplary embodiment of a sub-pixel, FIG. 21 is a detailed plan view of the area E of FIG. 20, and FIG. 22 is a cross-sectional view taken along line VI-VI' of FIG. 20.

The exemplary embodiment of FIGS. 20 to 22 is different from the exemplary embodiment of FIGS. 13 to 15 in that the shielding electrode SHE is disposed in the same layer as the first sub-driving voltage line SVDDL1, and extends from the first sub-driving voltage line SVDDL1.

Referring to FIGS. 20 to 22, the shielding electrode SHE may include a protrusion portion PRP and a shielding portion SHP.

The protrusion portion PRP may protrude from the first sub-driving voltage line SVDDL1 and extend in the first direction (X-axis direction). One end of the protrusion portion PRP may be adjacent to the j+1$_{th}$ data line Dj+1. One end of the protrusion portion PRP may be adjacent to the data connection electrode DCE in the first direction (X-axis direction). The protrusion portion PRP may not overlap the j+1$_{th}$ data line Dj+1 in the third direction (Z-axis direction). The protrusion portion PRP may not overlap the data connection electrode DCE in the third direction (Z-axis direction).

The protrusion portion PRP may be disposed between the second connection electrode VIE and the gate electrode GT-1 of the (1-1)th transistor ST1-1 in the second direction (Y-axis direction). The protrusion portion PRP may not overlap the second connection electrode VIE and the gate electrode GT-1 of the (1-1)th transistor ST1-1 in the third direction (Z-axis direction).

The shielding portion SHP may overlap at least a part of the first transistor ST1 in the third direction (Z-axis direction). The shielding portion SHP may overlap the first electrode S1-1 of the (1-1)th transistor ST1-1 and the second electrode D1-2 of the (1-2)th transistor ST1-2 in the third direction (Z-axis direction).

The shielding portion SHP may protrude from the protrusion portion PRP and extend in the second direction (Y-axis direction). The shielding portion SHP may protrude from one end of the protrusion portion PRP. One end of the shielding portion SHP may be adjacent to the k$_{th}$ scan line Sk in the second direction (Y-axis direction). The shielding portion SHP may not overlap the k$_{th}$ scan line Sk in the third direction (Z-axis direction).

The first electrode S1-1 of the (1-1)th transistor ST1-1 and the second electrode D1-2 of the (1-2)th transistor ST1-2 may be disposed on the buffer film BF, the shielding electrode SHE, the first sub-driving voltage line SVDDL1, and the data connection electrode DCE may be disposed on the second interlayer insulating film 142, and the j+1$_{th}$ data line Dj+1 may be disposed on the first organic film 160.

According to the exemplary embodiment of FIGS. 20 to 22, the shielding electrode SHE may overlap at least a part of the first transistor ST1 in the third direction (Z-axis direction). In an exemplary embodiment, the shielding electrode SHE may overlap the first electrode S1-1 of the (1-1)th transistor ST1-1 and the second electrode D1-2 of the (1-2)th transistor ST1-2 in the third direction (Z-axis direction), for example. The shielding electrode SHE may be disposed between the first electrode S1-1 of the (1-1)th transistor ST1-1 and the j+1$_{th}$ data line Dj+1 and between the second electrode D1-2 of the (1-2)th transistor ST1-2 and the j+1$_{th}$ data line Dj+1 to serve as a barrier. Therefore, the influence of data voltage transition of the j+1$_{th}$ data line Dj+1 on the first electrode S1-1 of the (1-1)th transistor ST1-1 and the second electrode D1-2 of the (1-2)th transistor ST1-2 may be reduced.

Further, since the shielding electrode SHE does not overlap the j+1$_{th}$ data line Dj+1 in the third direction (Z-axis direction), the parasitic capacitance provided between the shielding electrode SHE and the j+1$_{th}$ data line Dj+1 may be reduced. Therefore, the influence of data voltage transitions of the data line Dj and Dj+1 on the first driving voltage line VDDL may be reduced.

Figure 23:
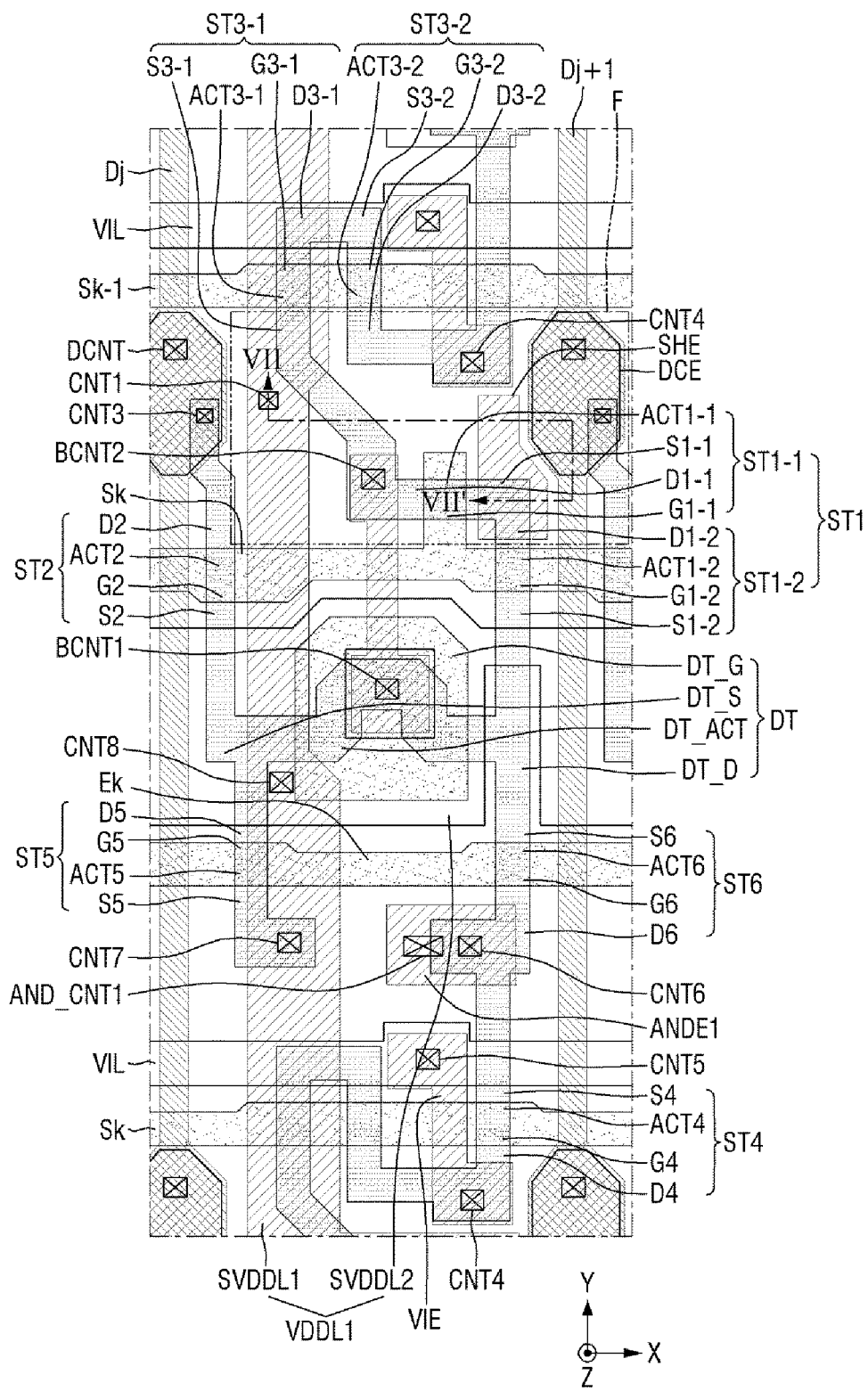
FIG. 23 is a detailed plan view of another exemplary embodiment of a sub-pixel.
Figure 24:
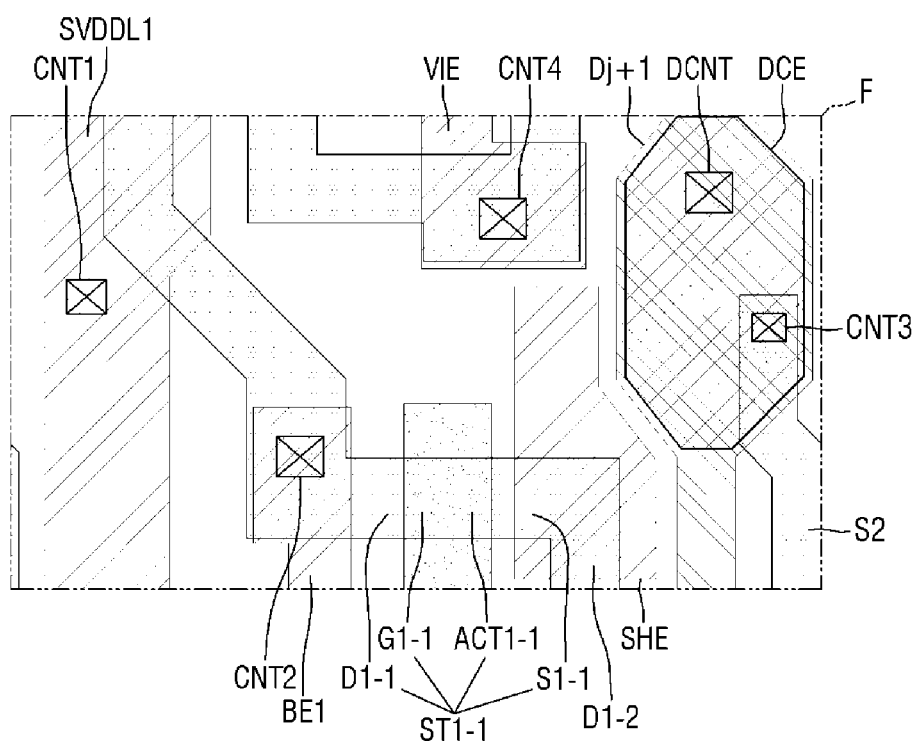
FIG. 24 is a detailed plan view of the area F of FIG. 23.
Figure 25:
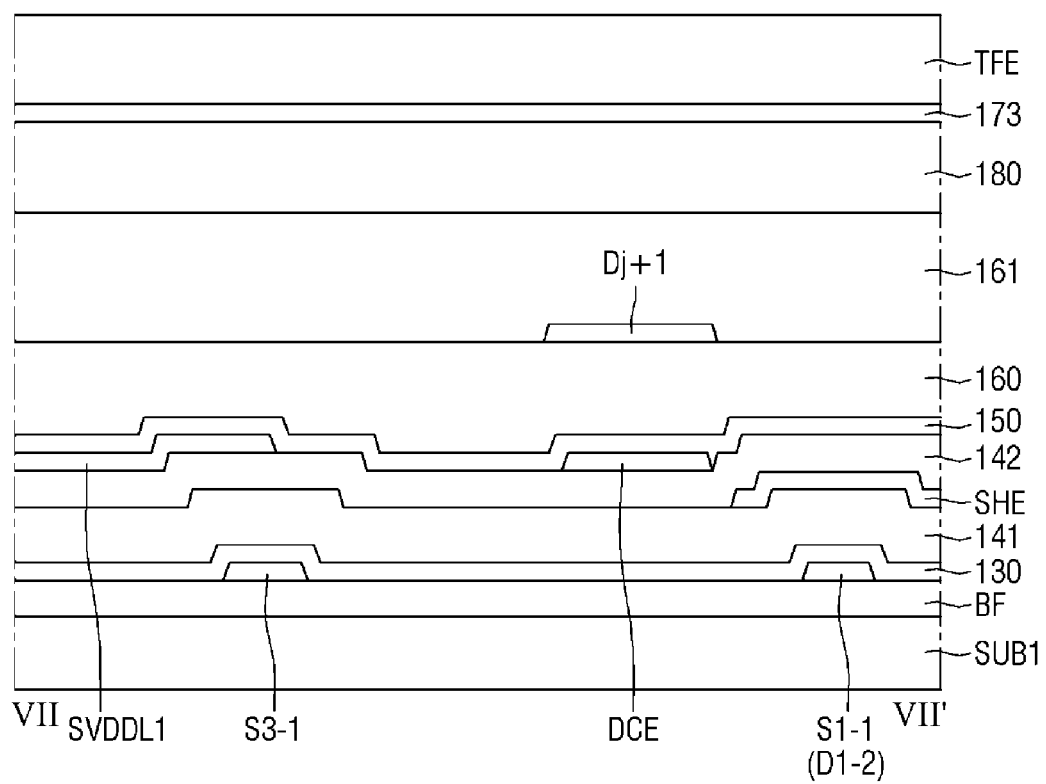
FIG. 25 is a cross-sectional view taken along line VII-VII' of FIG. 23.

FIG. 23 is a detailed plan view of another exemplary embodiment of a sub-pixel, FIG. 24 is a detailed plan view of the area F of FIG. 23, and FIG. 25 is a cross-sectional view taken along line VII-VII' of FIG. 23.

The exemplary embodiment of FIGS. 23 to 25 is different from the exemplary embodiment of FIGS. 13 to 15 in that the shielding electrode SHE is not connected to the first sub-driving voltage line SVDDL1, and is electrically floated.

Referring to FIGS. 23 to 25, since the shielding electrode SHE is not connected to the line or the electrode, the shielding electrode SHE may be electrically floated. The shielding electrode SHE may overlap at least a part of the first transistor ST1 in the third direction (Z-axis direction). The shielding electrode SHE may overlap the first electrode S1-1 of the (1-1)th transistor ST1-1 and the second electrode D1-2 of the (1-2)th transistor ST1-2 in the third direction (Z-axis direction).

The shielding electrode SHE may extend in the second direction (Y-axis direction). The shielding electrode SHE may be disposed between the second connection electrode VIE and the $k_{th}$ scan line Sk in the second direction (Y-axis direction). The shielding electrode SHE may not overlap the second connection electrode VIE and the $k_{th}$ scan line Sk in the third direction (Z-axis direction).

The first electrode S1-1 of the (1-1)th transistor ST1-1 and the second electrode D1-2 of the (1-2)th transistor ST1-2 may be disposed on the buffer film BF, and the shielding electrode SHE may be disposed on the first interlayer insulating film 141. The first sub-driving voltage line SVDDL1 and the data connection electrode DCE may be disposed on the second interlayer insulating film 142, and the $j+1_{th}$ data line Dj+1 may be disposed on the first organic film 160.

According to the exemplary embodiment of FIGS. 23 to 25, the shielding electrode SHE may overlap at least a part of the first transistor ST1 in the third direction (Z-axis direction). In an exemplary embodiment, the shielding electrode SHE may overlap the first electrode S1-1 of the (1-1)th transistor ST1-1 and the second electrode D1-2 of the (1-2)th transistor ST1-2 in the third direction (Z-axis direction), for example. The shielding electrode SHE may be disposed between the first electrode S1-1 of the (1-1)th transistor ST1-1 and the $j+1_{th}$ data line Dj+1 and between the second electrode D1-2 of the (1-2)th transistor ST1-2 and the $j+1_{th}$ data line Dj+1 to serve as a barrier. Therefore, the influence of data voltage transition of the $j+1_{th}$ data line Dj+1 on the first electrode S1-1 of the (1-1)th transistor ST1-1 and the second electrode D1-2 of the (1-2)th transistor ST1-2 may be reduced.

Figure 26:
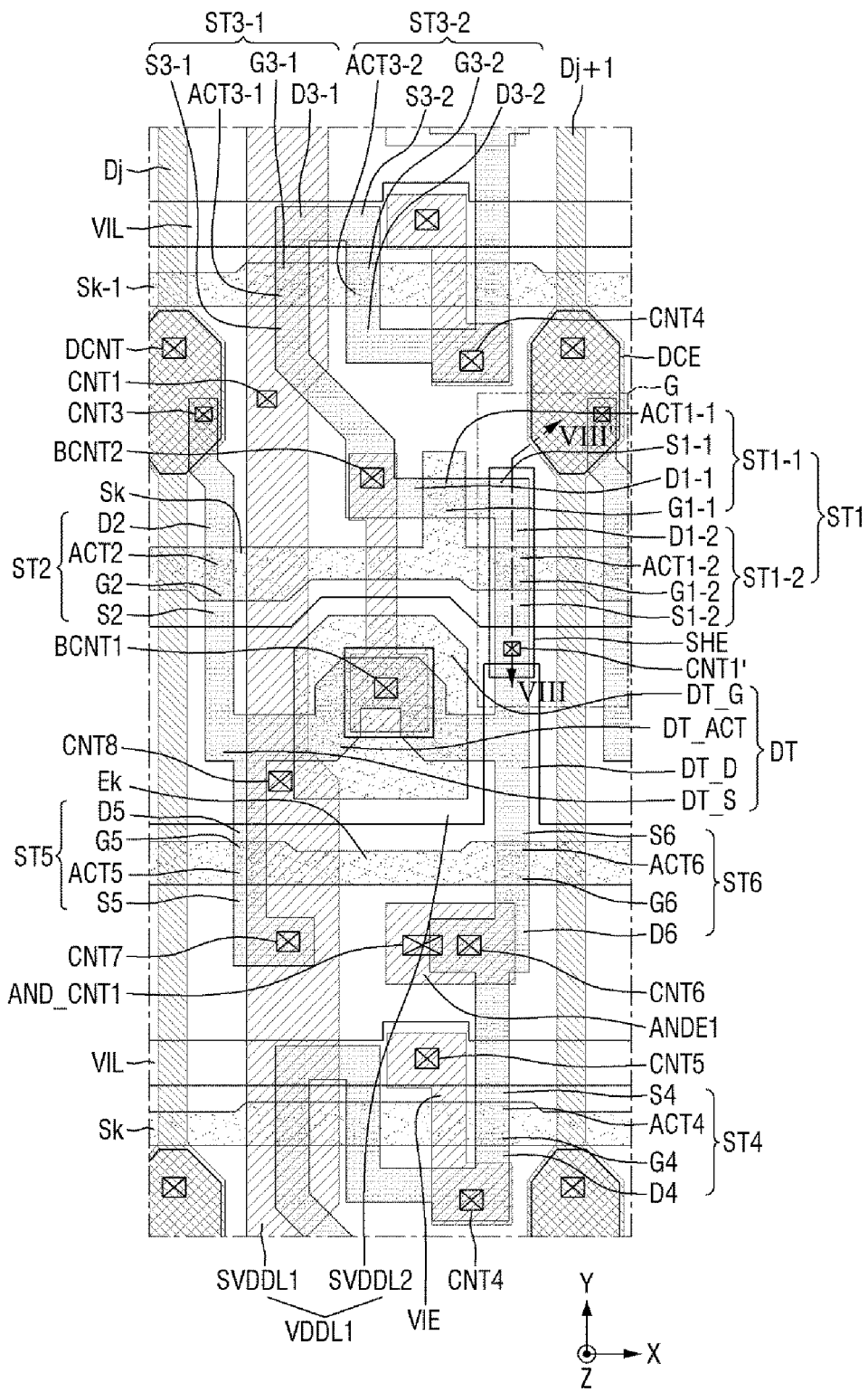
FIG. 26 is a detailed plan view of another exemplary embodiment of a sub-pixel.
Figure 27:
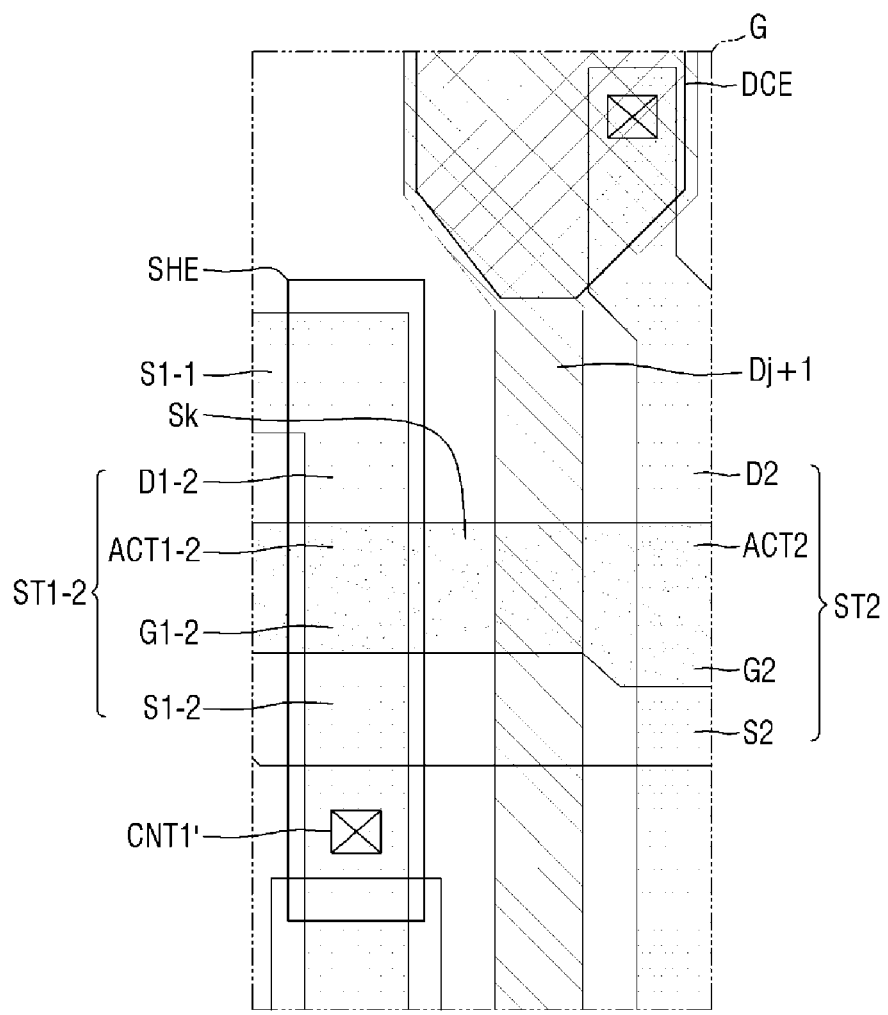
FIG. 27 is a detailed plan view of the area G of FIG. 26.
Figure 28:
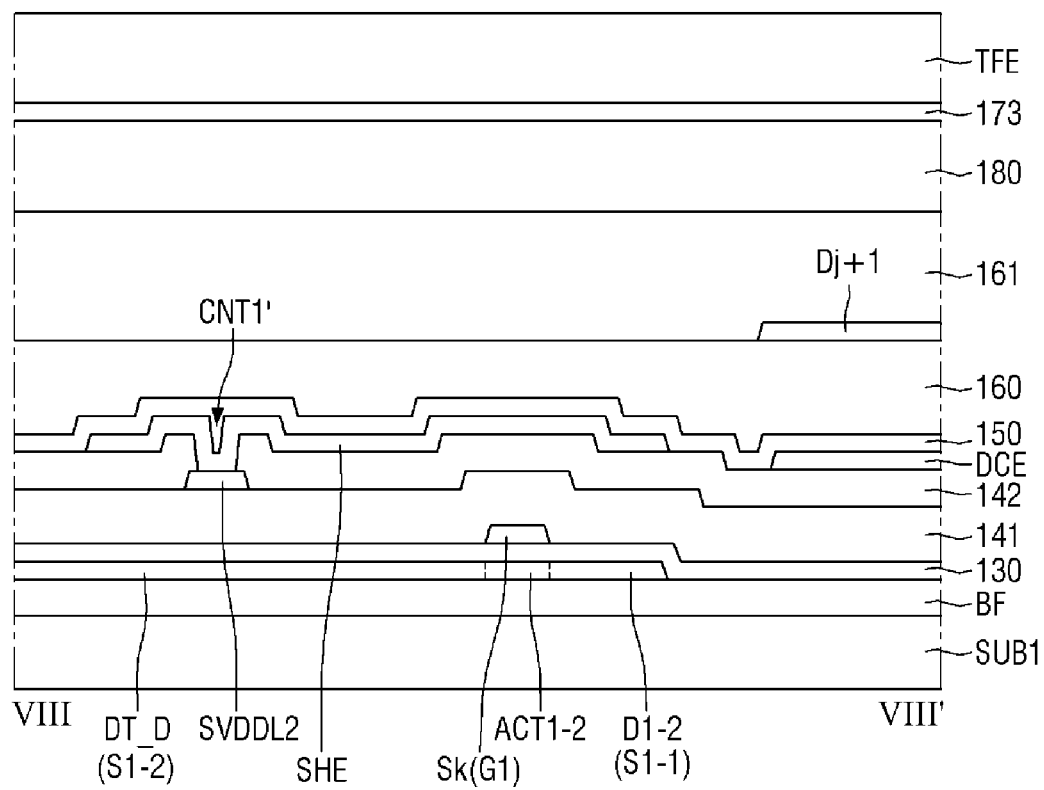
FIG. 28 is a cross-sectional view taken along line VIII-VIII' of FIG. 26.

FIG. 26 is a detailed plan view of another exemplary embodiment of a sub-pixel, FIG. 27 is a detailed plan view of the area G of FIG. 26, and FIG. 28 is a cross-sectional view taken along line VIII-VIII' of FIG. 26.

The exemplary embodiment of FIGS. 26 to 28 is different from the exemplary embodiment of FIGS. 13 to 15 in that the shielding electrode SHE is connected to the second sub-driving voltage line SVDDL2, not the first sub-driving voltage line SVDDL1.

Referring to FIGS. 26 to 28, the shielding electrode SHE may overlap at least a part of the first transistor ST1 in the third direction (Z-axis direction). The shielding electrode SHE may overlap the first electrode S1-1 of the (1-1)th transistor ST1-1 and the second electrode D1-2 of the (1-2)th transistor ST1-2 in the third direction (Z-axis direction).

The shielding electrode SHE may be connected to the second sub-driving voltage line SVDDL2 through the first contact hole CNT1'. The shielding electrode SHE may be disposed on the second interlayer insulating film 142, and in this case, the first contact hole CNT1' may be a hole penetrating the second interlayer insulating film 142.

The shielding electrode SHE may extend in the second direction (Y-axis direction). The shielding electrode SHE may intersect the $k_{th}$ scan line Sk.

The first electrode S1-1 of the (1-1)th transistor ST1-1 and the second electrode D1-2 of the (1-2)th transistor ST1-2 may be disposed on the buffer film BF, and the second sub-driving voltage line SVDDL2 may be disposed on the first interlayer insulating film 141. The shielding electrode SHE, the first sub-driving voltage line SVDDL1, and the data connection electrode DCE may be disposed on the second interlayer insulating film 142, and the $j+1_{th}$ data line Dj+1 may be disposed on the first organic film 160.

According to the exemplary embodiment of FIGS. 26 to 28, the shielding electrode SHE may overlap at least a part of the first transistor ST1 in the third direction (Z-axis direction). In an exemplary embodiment, the shielding electrode SHE may overlap the first electrode S1-1 of the (1-1)th transistor ST1-1 and the second electrode D1-2 of the (1-2)th transistor ST1-2 in the third direction (Z-axis direction), for example. The shielding electrode SHE may be disposed between the first electrode S1-1 of the (1-1)th transistor ST1-1 and the $j+1_{th}$ data line Dj+1 and between the second electrode D1-2 of the (1-2)th transistor ST1-2 and the $j+1_{th}$ data line Dj+1 to serve as a barrier. Therefore, the influence of data voltage transition of the $j+1_{th}$ data line Dj+1 on the first electrode S1-1 of the (1-1)th transistor ST1-1 and the second electrode D1-2 of the (1-2)th transistor ST1-2 may be reduced.

In exemplary embodiments of the display device, a shielding electrode may overlap at least a part of a transistor adjacent to a data line in a thickness direction of a substrate. In this case, the shielding electrode is disposed between the data line and the transistor adjacent to the data line to serve as a barrier. Therefore, the influence of data voltage transition of the data line on the first electrode or second electrode of the transistor adjacent to the data line may be reduced.

Further, in exemplary embodiments of the display device, the overlapping area of the shielding electrode and the data line in thickness direction of the substrate is reduced, or the shielding electrode and the data line are disposed not to overlap each other, thereby reducing the parasitic capacitance provided between the shielding electrode and the data line. Therefore, the influence of data voltage transitions of the data lines on the shielding electrode and the first driving voltage line may be reduced.

The invention should not be construed as being limited to the exemplary embodiments set forth herein. Rather, these exemplary embodiments are provided so that this invention will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention.

What is claimed is:

1. A display device, comprising:
   a substrate;
   data lines arranged on the substrate, the data lines to which data voltages are applied;
   scan lines arranged on the substrate, the scan lines to which scan signals are applied; and
   a first pixel connected to a first data line of the data lines and at least one scan line of the scan lines; and
   a second pixel connected to a second data line of the data lines and the at least one scan line, wherein the first data line and the second data line neighbor each other, and wherein the first pixel including:
  a light emitting element;
  a driving transistor which includes a gate electrode, a first electrode and a second electrode and supplies a driving current flowing between the first electrode and the second electrode to the light emitting element in accordance with the data voltage of the first data line applied to the gate electrode;
  a first transistor between the gate electrode and second electrode of the driving transistor; and
  a shielding electrode overlapping at least a part of the first transistor in a thickness direction of the substrate,
wherein the shielding electrode does not overlap the first data lines in the thickness direction of the substrate.

2. The display device of claim 1, further comprising:
first driving voltage lines arranged on the substrate, the first driving voltage lines to which a first driving voltage is applied,
wherein the first pixel is connected to a first driving voltage line of the first driving voltage lines, and
the shield electrode is connected to the first driving voltage line.

3. The display device of claim 2,
wherein the first transistor includes:
a (1-1)th transistor including a gate electrode connected to a scan line of the scan lines, a first electrode, and a second electrode; and
a (1-2)th transistor including a gate electrode connected to the scan line, a first electrode connected to the second electrode of the driving transistor, and a second electrode connected to the first electrode of the (1-1)th transistor,
wherein the second electrode of the (1-1)th transistor is connected to the gate electrode of the driving transistor.

4. The display device of claim 3,
wherein the shielding electrode overlaps the first electrode of the (1-1)th transistor and the second electrode of the (1-2)th transistor in the thickness direction of the substrate.

5. The display device of claim 3,
wherein the first pixel further includes:
a second transistor which supplies the data voltage of the first data line to the gate electrode of the driving transistor; and
a (3-1)th transistor including a gate electrode connected to another scan line of the scan lines and a first electrode connected to the gate electrode of the driving transistor.

6. The display device of claim 5,
wherein the shielding electrode includes:
a connection portion extending in a first direction and connected to the first driving voltage line;
a protrusion portion protruding and extending from the connection portion in a second direction crossing the first direction; and
a shielding portion protruding from the protrusion portion and overlapping the first electrode of the (1-1)th transistor and the second electrode of the (1-2)th transistor in the thickness direction of the substrate.

7. The display device of claim 6,
wherein the connection portion is between the scan line and the another scan line adjacent to the scan line in the first direction, and does not overlap the scan line and the another scan line in the thickness direction of the substrate.

8. The display device of claim 6,
wherein the protrusion portion is adjacent to the second data line, and overlaps the second data line in the thickness direction of the substrate.

9. The display device of claim 6,
wherein the shielding portion extends in the first direction.

10. The display device of claim 6,
wherein the protrusion portion is adjacent to the second data line, and does not overlap the second data line in the thickness direction of the substrate.

11. The display device of claim 6,
wherein the first pixel further includes a first connection electrode connecting the gate electrode of the driving transistor and the second electrode of the (1-1)th transistor and disposed in the same layer as the data lines, and
the first connection electrode is adjacent to the connection portion in the first direction, and is adjacent to the protrusion portion in the second direction.

12. The display device of claim 2,
wherein the first driving voltage line includes:
a first sub-driving voltage line extending in a first direction; and
a second sub-driving voltage line extending in a second direction crossing the first direction,
wherein the shielding electrode is connected to the first sub-driving voltage line.

13. The display device of claim 12,
wherein the at least one scan line and the gate electrode of the driving transistor are disposed on a gate insulating film disposed on the substrate,
the shielding electrode and the second sub-driving voltage line are disposed on a first interlayer insulating film disposed on the at least one scan line and the gate electrode of the driving transistor,
the first sub-driving voltage line and the first electrode and second electrode of the driving transistor are disposed on a second interlayer insulating film disposed on the shielding electrode and the second sub-driving voltage line, and
the data lines are disposed on a first organic film disposed on the first sub-driving voltage line and the first electrode and second electrode of the driving transistor.

14. The display device of claim 13,
wherein the first sub-driving voltage line is connected to the shielding electrode through a first contact hole penetrating the second interlayer insulating film.

15. The display device of claim 12,
wherein the shielding electrode is disposed on the substrate,
the at least one scan line and the gate electrode of the driving transistor are disposed on a buffer film disposed on the shielding electrode,
the second sub-driving voltage line is disposed on a first interlayer insulating film disposed on the at least one scan line and the gate electrode of the driving transistor,
the first sub-driving voltage line and the first electrode and second electrode of the driving transistor are disposed on a second interlayer insulating film disposed on the second sub-driving voltage line, and
the data lines are disposed on a first organic film disposed on the first sub-driving voltage line and the first electrode and second electrode of the driving transistor.

16. The display device of claim 15,
wherein the first sub-driving voltage line is connected to the shielding electrode through a first contact hole penetrating the buffer film, the first interlayer insulating film, and the second interlayer insulating film.

17. The display device of claim 1,
wherein the first pixel includes:
a second transistor supplying the data voltage to the gate electrode of the driving transistor; and
a data connection electrode connecting the first data line and the first electrode of the second transistor,
wherein the shielding electrode overlaps the data connection electrode in the thickness direction of the substrate.

18. The display device of claim 12,
wherein the shielding electrode includes:
a protrusion portion protruding and extending from the first sub-driving voltage line in the second direction crossing the first direction; and
a shielding portion extending from the protrusion portion and overlapping at least a part of the first transistor in the thickness direction of the substrate.

19. The display device of claim 1,
wherein the shielding electrode is electrically floated.

20. The display device of claim 2,
wherein the shielding electrode is spaced apart from the first driving voltage line.

21. The display device of claim 2,
wherein the first driving voltage line includes:
a first sub-driving voltage line extending in a first direction; and
a second sub-driving voltage line extending in the second direction crossing the first direction,
wherein the shielding electrode is connected to the second sub-driving voltage line.

22. The display device of claim 21,
wherein the shielding electrode extends in the first direction.

23. The display device of claim 21,
wherein the shielding electrode intersects the at least one scan line.

24. The display device of claim 21,
wherein the at least one scan line and the gate electrode of the driving transistor are disposed on a gate insulating film disposed on the substrate,
the second sub-driving voltage line is disposed on a first interlayer insulating film disposed on the at least one scan line and the gate electrode of the driving transistor,
the first sub-driving voltage line and the first electrode and second electrode of the driving transistor are disposed on a second interlayer insulating film disposed on the second sub-driving voltage line, and
the data lines and the shielding electrode are disposed on a first organic film disposed on the first sub-driving voltage line and the first electrode and second electrode of the driving transistor.

25. The display device of claim 24,
wherein the shielding electrode is connected to the second sub-driving voltage line through a first contact hole penetrating the first organic film and the second interlayer insulating film.

26. A display device, comprising:
a substrate;
a light emitting element;
a driving transistor which includes a gate electrode, a first electrode and a second electrode and supplies a driving current flowing between the first electrode and the second electrode to the light emitting element in accordance with a data voltage of a first data line applied to the gate electrode;
a first transistor disposed adjacent to a second data line immediately subsequent to the first data line; and
a shielding electrode overlapping at least a part of the first transistor in a thickness direction of the substrate,
wherein the driving transistor and the first transistor are disposed between the first data line and the second data line, and
the shielding electrode does not overlap at least a center portion, along a direction in which the first and second data lines are arranged, of the second data line.

* * * * *